US012563936B2

(12) United States Patent
Lee et al.

(10) Patent No.: US 12,563,936 B2
(45) Date of Patent: Feb. 24, 2026

(54) DISPLAY DEVICE INCLUDING DIFFERENT NUMBER OF LIGHT-EMITTING LAYER FOR DIFFERENT PIXEL AREA

(71) Applicant: Samsung Display Co., Ltd., Yongin-Si (KR)

(72) Inventors: Seokjae Lee, Seongnam-si (KR); Yunjae Kim, Suwon-si (KR); Jungkyun Kim, Gunpo-si (KR); Hyungu Kim, Yongin-si (KR); Bohun Park, Cheonan-si (KR); Jin Woo Park, Yongin-si (KR); Jungjin Yang, Seoul (KR); Bum Suk Lee, Hwaseong-si (KR); Sunhye Lee, Hwaseong-si (KR); Jaejin Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 555 days.

(21) Appl. No.: 17/358,593

(22) Filed: Jun. 25, 2021

(65) Prior Publication Data

US 2022/0123061 A1 Apr. 21, 2022

(30) Foreign Application Priority Data

Oct. 19, 2020 (KR) ........................ 10-2020-0135256

(51) Int. Cl.
*H10K 59/35* (2023.01)
*H10K 50/17* (2023.01)
(Continued)

(52) U.S. Cl.
CPC ............. *H10K 59/35* (2023.02); *H10K 50/17* (2023.02); *H10K 50/19* (2023.02); *H10K 59/876* (2023.02); *H10K 59/8791* (2023.02)

(58) Field of Classification Search
CPC ....... H10K 59/35; H10K 50/852; H10K 50/19
(Continued)

(56) References Cited

U.S. PATENT DOCUMENTS

| | | | |
|---|---|---|---|
| 8,525,157 | B2 | 9/2013 | Jeong et al. |
| 10,373,559 | B2 | 8/2019 | Kim et al. |

(Continued)

FOREIGN PATENT DOCUMENTS

| | | | |
|---|---|---|---|
| EP | 3561875 | A1 | 10/2019 |
| KR | 1020110096451 | A | 8/2011 |

(Continued)

*Primary Examiner* — Xia L Cross
(74) *Attorney, Agent, or Firm* — CANTOR COLBURN LLP

(57) ABSTRACT

A display device includes a substrate in which first and second pixel areas respectively emitting first and second light respectively having different emission wavelengths from each other are defined, a first electrode on the substrate to overlap the first and second pixel areas, a hole transport region on the first electrode to overlap the first and second pixel areas, first and second organic layers on the hole transport region to respectively overlap the first and second pixel areas, an electron transport region on the first and second organic layers to overlap the first and second pixel areas, and a second electrode on the electron transport region to overlap the first and second pixel areas. The first organic layer includes first emission layers emitting the first light and a first charge generation layer between the first emission layers, and the second organic layer includes a single second emission layer emitting the second light.

14 Claims, 13 Drawing Sheets

(51) Int. Cl.
*H10K 50/19* (2023.01)
*H10K 59/80* (2023.01)

(58) Field of Classification Search
USPC .......................................................... 257/40
See application file for complete search history.

(56) References Cited

U.S. PATENT DOCUMENTS

| | | | | |
|---|---|---|---|---|
| 10,622,411 | B2 | 4/2020 | Park et al. | |
| 2010/0090241 | A1* | 4/2010 | D'Andrade | H10K 59/35 257/40 |
| 2011/0227125 | A1 | 9/2011 | Tsutsui et al. | |
| 2015/0144926 | A1* | 5/2015 | Lee | H10K 50/131 257/40 |
| 2015/0188087 | A1* | 7/2015 | Lee | H10K 50/856 257/40 |
| 2019/0148663 | A1 | 5/2019 | Lee et al. | |
| 2019/0189969 | A1* | 6/2019 | Youn | H10K 50/852 |
| 2019/0326542 | A1* | 10/2019 | Yang | H10K 59/32 |
| 2020/0006443 | A1 | 1/2020 | Park et al. | |

FOREIGN PATENT DOCUMENTS

| | | | | |
|---|---|---|---|---|
| KR | 1020140142462 | A | 12/2014 | |
| KR | 20160038480 | * | 4/2016 | H01L 27/32 |
| KR | 1020160038480 | A | 4/2016 | |
| KR | 1020170074468 | A | 6/2017 | |
| KR | 1020180047621 | A | 5/2018 | |
| KR | 1020190055281 | A | 5/2019 | |
| KR | 1020190071213 | A | 6/2019 | |
| KR | 1020200001414 | A | 1/2020 | |

* cited by examiner

DISPLAY DEVICE INCLUDING DIFFERENT NUMBER OF LIGHT-EMITTING LAYER FOR DIFFERENT PIXEL AREA

This application claims priority to Korean Patent Application No. 10-2020-0135256, filed on Oct. 19, 2020, and all the benefits accruing therefrom under 35 U.S.C. § 119, the content of which in its entirety is herein incorporated by reference.

BACKGROUND

1. Field

Embodiments of the invention herein relate to a display device, and more particularly, to a display device having increased display efficiency and luminance lifespan as well as preventing an increase in driving voltage.

2. Description of the Related Art

Organic light emitting elements have a high response speed and are self-luminous type elements driven at a low voltage. Accordingly, organic light emitting display devices including the organic light emitting elements may omit separate light sources to have a benefit of being reduced in weight and thickness and having excellent luminance and no viewing angle dependence.

The organic light emitting elements are display elements having an emission layer formed of an organic material between an anode electrode and a cathode electrode. Holes provided from the anode electrode and electrons provided from the cathode electrode combine in the emission layer to form excitons, and then light corresponding to energy between the holes and the electrons is generated from the excitons.

Tandem organic light emitting elements have a structure formed of at least two stacks of hole transport layer/emission light/electron transport layer between the anode electrode and the cathode electrode, and have a charge generation layer between respective stacks to help generate and transfer charges.

SUMMARY

Embodiments of the invention provide a display device having increased display efficiency and luminance lifespan as well as preventing an increase in driving voltage.

An embodiment of the invention provides a display device including a substrate in which a first pixel area emitting first light and a second pixel area emitting second light having a different emission wavelength from an emission wavelength of the first light are defined, a first electrode disposed on the substrate and overlapping the first pixel area and the second pixel area, a hole transport region disposed on the first electrode and overlapping the first pixel area and the second pixel area, a first organic layer disposed on the hole transport region and overlapping the first pixel area, a second organic layer disposed on the hole transport region and overlapping the second pixel area, an electron transport region disposed on the first organic layer and the second organic layer and overlapping the first pixel area and the second pixel area, and a second electrode disposed on the electron transport region and overlapping the first pixel area and the second pixel area, where the first organic layer includes a plurality of first emission layers emitting the first light, and a first charge generation layer disposed between the plurality of first emission layers, and the second organic layer includes a second emission layer emitting the second light.

In an embodiment, the first light may be blue light, and the second light may be green light or red light.

In an embodiment, a third pixel area emitting third light having a different emission wavelength from the emission wavelength of the first light and the emission wavelength of the second light may be defined in the substrate, and the display device may further include a third organic layer disposed on the hole transport region and overlapping the third pixel area.

In an embodiment, the third organic layer may include a plurality of third emission layers emitting the third light and a third charge generation layer disposed between the plurality of third emission layers.

In an embodiment, the third organic layer may include a single third emission layer emitting the third light.

In an embodiment, the second emission layer may be in contact with the hole transport region and the electron transport region.

In an embodiment, the hole transport region may include a hole injection layer disposed on the first electrode and a hole transport layer disposed on the hole injection layer, and the electron transport region may include an electron transport layer disposed on the first organic layer and the second organic layer and an electron injection layer disposed on the electron transport layer.

In an embodiment, the hole transport region may further include a hole side additional layer disposed between the first and second organic layers and the hole transport layer, the electron transport region may further include an electron side additional layer disposed between the first and second organic layers and the electron transport layer, and the second emission layer may be in contact with the hole side additional layer and the electron side additional layer.

In an embodiment, the display device may further include a capping layer disposed on the second electrode, where the capping layer has a refractive index of about 1.6 or greater.

In an embodiment, the first organic layer may include a first sub-emission layer disposed between the hole transport region and the first charge generation layer, and a second sub-emission layer disposed between the first charge generation layer and the electron transport region.

In an embodiment, the first sub-emission layer may be spaced apart from the first electrode by an $n^{th}$ resonance distance of the first light where n is an integer of 1 or greater, the second sub-emission layer may be spaced apart from the first electrode by an $(n+a)^{th}$ resonance distance of the first light where a is an integer of 1 or greater, and n and a may be each independently an integer of 1 or greater.

In an embodiment, the first charge generation layer may include an n-type charge generation layer disposed adjacent to the first sub-emission layer and a p-type charge generation layer disposed adjacent to the second sub-emission layer.

In an embodiment, the display device may further include a thin film encapsulation layer disposed on the second electrode, and an anti-reflection layer disposed on the thin film encapsulation layer.

In an embodiment of the invention, a display device includes a substrate in which a first pixel area emitting first light, a second pixel area emitting second light different from the first light, and a third pixel area emitting third light different from the first light and the second light are defined, a first light emitting element overlapping the first pixel area, a second light emitting element overlapping the second pixel area, and a third light emitting element overlapping the third pixel area, where one or two of the first light emitting element, the second light emitting element, and the third light emitting element include at least two light emitting unit structures each including a single emission layer, and remaining two or remaining one of the first light emitting element, the second light emitting element, and the third light emitting element include a single light emitting unit structure including a single emission layer.

In an embodiment, the first light emitting element, the second light emitting element, and the third light emitting element each may include a first electrode and a second electrode spaced apart from the first electrode with the at least two light emitting unit structures or the single light emitting unit therebetween, and the at least two light emitting unit structures each may include a hole transport layer disposed on the first electrode, the single emission layer disposed on the hole transport layer, and an electron transport layer disposed on the single emission layer.

In an embodiment, the first light emitting element may include at least two light emitting unit structures, the second light emitting element may include a single light emitting unit structure, and in the second light emitting element, the single light emitting unit structure may be in contact with the first electrode and the second electrode.

In an embodiment of the invention, a display device includes a substrate in which a first pixel area emitting first light and a second pixel area emitting second light different from the first light are defined, a first electrode disposed on the substrate and overlapping the first pixel area and the second pixel area, a hole transport region disposed on the first electrode and overlapping the first pixel area and the second pixel area, a plurality of first emission layers disposed on the hole transport region and overlapping the first pixel area, a second emission layer disposed on the hole transport region and overlapping the second pixel area, an electron transport region disposed on the plurality of first emission layers and the second emission layer and overlapping the first pixel area and the second pixel area, and a second electrode disposed on the electron transport region and overlapping the first pixel area and the second pixel area, where the plurality of first emission layers include a first sub-emission layer spaced apart from the first electrode by an $n^{th}$ resonance distance of the first light where n is an integer of 1 or greater and a second sub-emission layer spaced apart from the first electrode by an $(n+a)^{th}$ resonance distance of the first light where a is an integer of 1 or greater.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
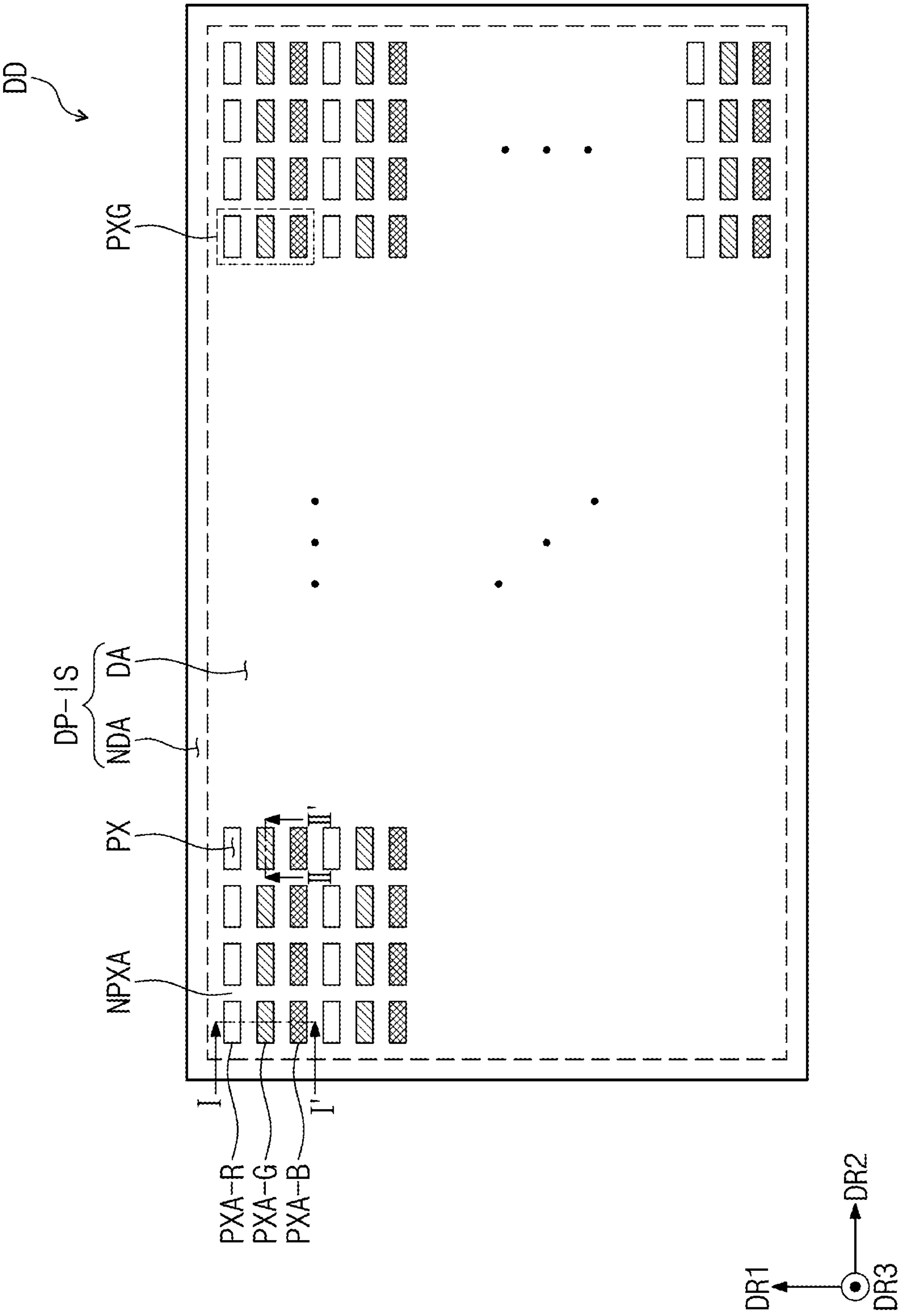
FIG. 1 is a perspective view of an embodiment of a display device according to the invention.

Hereinafter, embodiments of the invention will be described with reference to the accompanying drawings. In the description, when an element (or a region, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated configurations may define.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, a display device and a method for manufacturing the display device in an embodiment of the invention will be described with reference to the accompanying drawings.

Figure 2A:
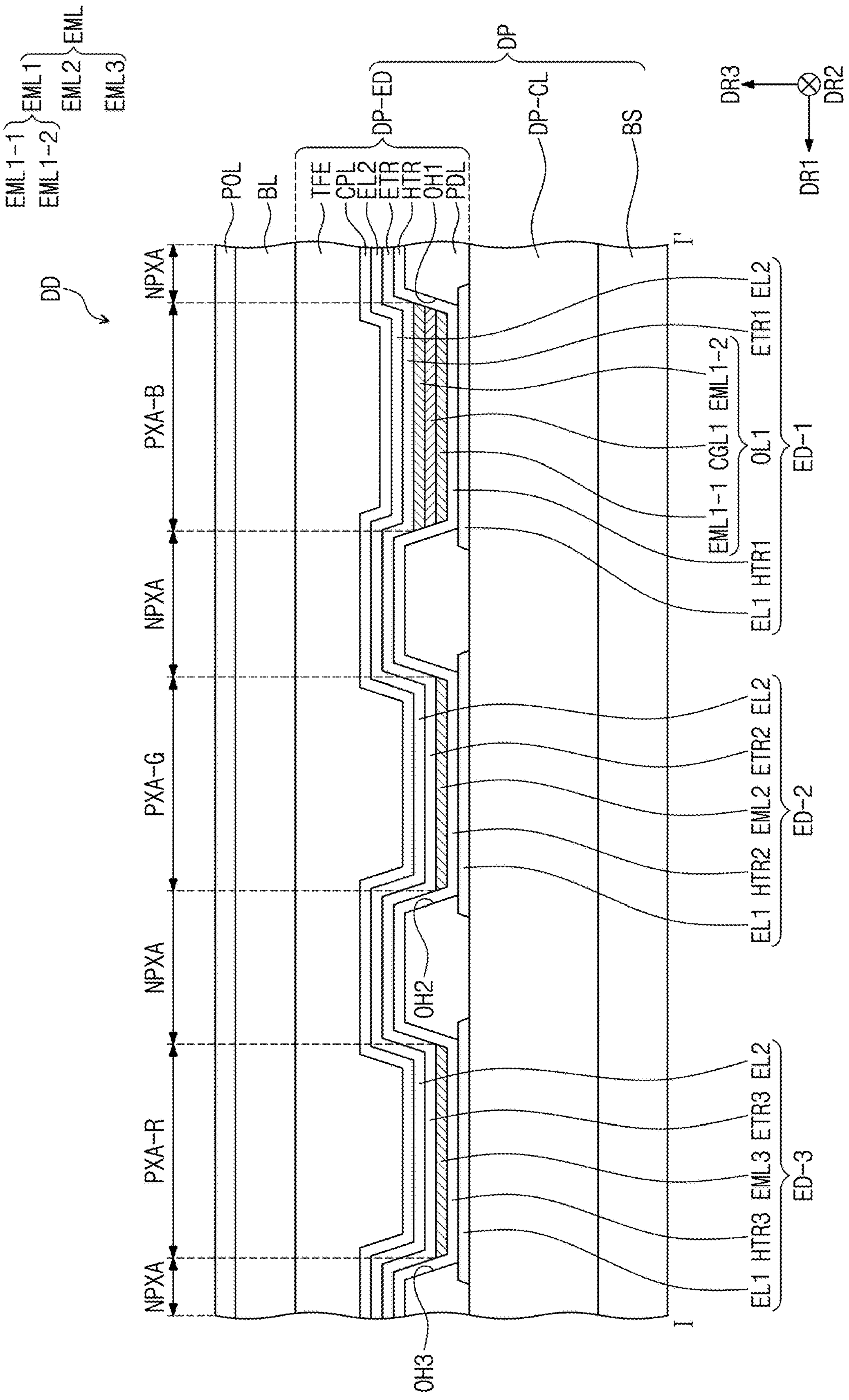
FIGS. 2A and 2B are cross-sectional views of an embodiment of a display device according to the invention.
Figure 2B:
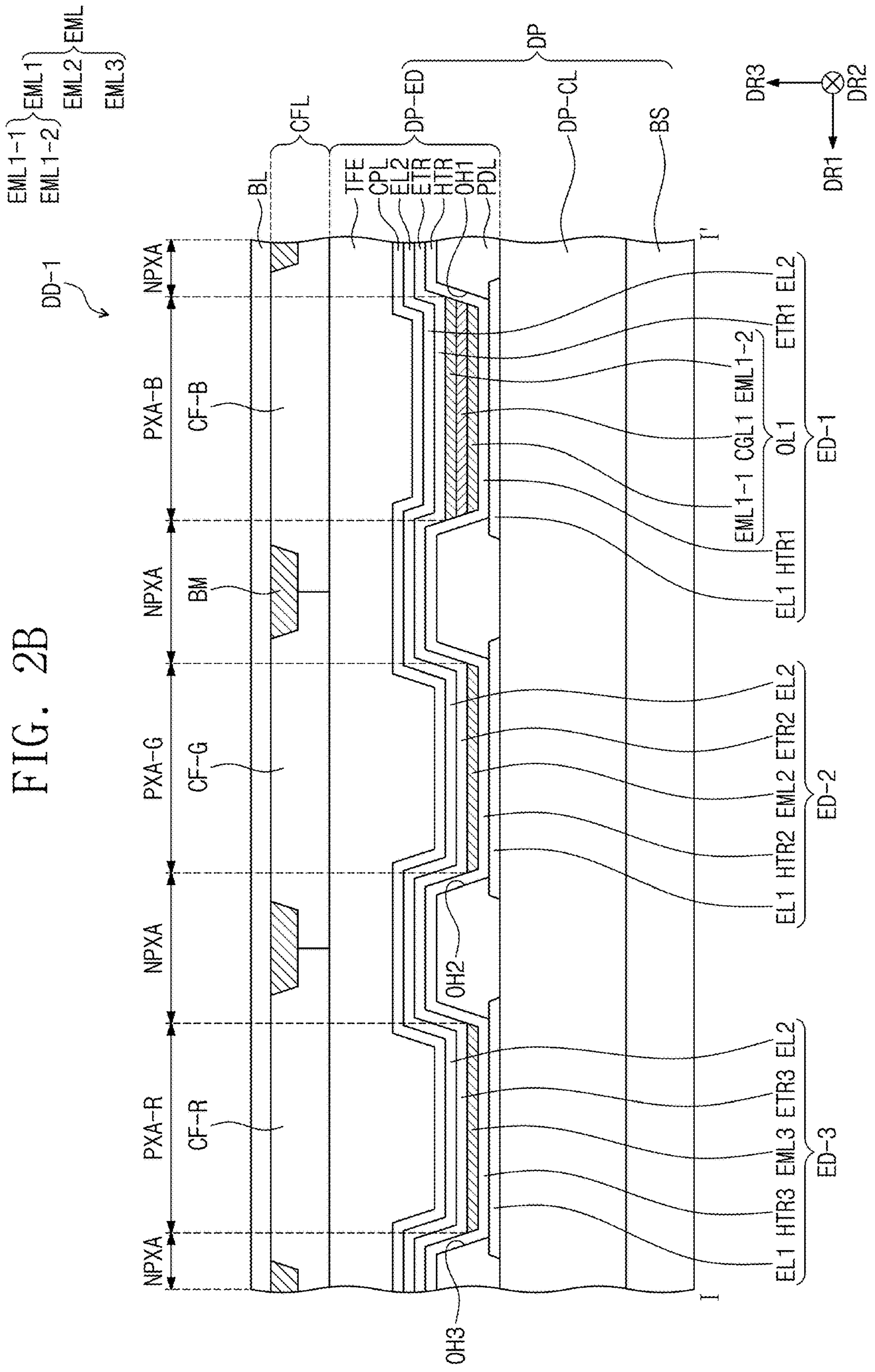

FIG. 1 is a perspective view of an embodiment of a display device according to the invention. FIGS. 2A and 2B are cross-sectional views of an embodiment of a display device according to the invention.

As shown in FIG. 1, a display device DD may display images through a display surface DP-IS. The display surface DP-IS may be a surface parallel to a plane defined by a first direction DR1 and a second direction DR2. The display surface DP-IS may include a display area DA and a non-display area NDA. A pixel PX is disposed in the display area DA. The non-display area NDA is defined along an edge of the display surface DP-IS. The non-display area NDA is adjacent to the display area DA. The non-display area NDA may surround the display area DA.

A normal direction of the display surface DP-IS, that is, a thickness direction of the display device DD may correspond to a third direction DR3. A front surface (or an upper surface) and a rear surface (or a lower surface) of respective layers or units which will be described below are defined by the third direction DR3. The front and rear surfaces oppose each other in the third direction DR3. The directions indicated by the first to third directions DR1, DR2, and DR3 are relative concepts, and may thus be changed to other directions. In an embodiment of the invention, the display device DD including a planar front surface DP-IS is illustrated, but is not limited thereto. The display device DD may further include a curved display surface or a three-dimensional ("3D") display surface. The 3D display surface may include a plurality of display areas indicating different directions.

FIGS. 2A and 2B illustrate cross-sections of a display device DD corresponding to line I-I' of FIG. 1. The display device DD of an embodiment includes a plurality of light emitting elements ED-1, ED-2, and ED-3, and the plurality of light emitting elements ED-1, ED-2, and ED-3 each includes a hole transport region HTR, an organic layer, and an electron transport region ETR which are sequentially disposed between the first electrode EL1 and the second electrode EL2. The first light emitting element ED-1 includes a first organic layer OL1 overlapping a first pixel area PXA-B. The second light emitting element ED-2 includes a second organic layer overlapping a second pixel area PXA-G. The third light emitting element ED-3 includes a third organic layer overlapping a third pixel area PXA-R.

The first light emitting elements ED-1 among the plurality of light emitting elements ED-1, ED-2, and ED-3 each include a plurality of emission layers EML1-1 and EML1-2, and second and third light emitting elements ED-2 and ED-3 include one emission layer EML2 and EML3, respectively. As shown in FIGS. 2A and 2B, the first light emitting element ED-1 includes two first emission layers EML1-1 and EML1-2 included in the first organic layer OL1, that is, an 1-1st sub-emission layer EML1-1 and a 2-1st sub-emission layer EML1-2, and the second light emitting element ED-2 includes one second emission layer EML2 included in the second organic layer. The third light emitting element ED-3 includes one third emission layer EML3 included in the third organic layer. In the first light emitting element ED-1 including the plurality of emission layers EML1-1 and EML1-2, a charge generation layer CGL1 is disposed between the plurality of emission layers EML1-1 and EML1-2. FIGS. 2A and 2B illustrate, as an example, that the first light emitting element ED-1 includes a plurality of emission layers, and the second light emitting element ED-2 and the third light emitting element ED-3 each include one emission layer, but the invention is not limited thereto, and the first light emitting element ED-1 may include one emission layer, and at least one of the second light emitting element ED-2 or the third light emitting element ED-3 may include a plurality of emission layers. In an alternative embodiment, the first light emitting element ED-1 may include a plurality of emission layers, one of the second light emitting element ED-2 or the third light emitting element ED-3 may include a plurality of emission layers, and the other one may include one emission layer. FIGS. 2A and 2B illustrate, as an example, that the first light emitting element ED-1 including a plurality of emission layers includes two first emission layers EML1-1 and EML1-2, but the invention is not limited thereto, and a light emitting element including a plurality of emission layers may include three or more emission layers.

A display panel DP of the display device DD in an embodiment may include a base layer BS, a circuit layer DP-CL disposed on the base layer BS, and a display element layer DP-ED disposed on the circuit layer DP-CL. The base layer BS may provide a base surface in which the display element layer DP-ED is disposed. In an embodiment, the base layer BS may be a glass substrate, a metal substrate, a plastic substrate, etc. However, the invention is not limited thereto.

In an embodiment, the circuit layer DP-CL may be disposed on the base layer BS. The circuit layer DP-CL may include a plurality of transistors (not shown). The transistors (not shown) each may include a control electrode, an input electrode, and an output electrode. In an embodiment, the circuit layer DP-CL may include a switching transistor and a driving transistor for driving the plurality of light emitting elements ED-1, ED-2 and ED-3 of the display element layer DP-ED, for example.

The display element layer DP-ED in an embodiment may include a pixel defining film PDL, a plurality of light emitting elements ED-1, ED-2, and ED-3 disposed between the pixel defining film PDL, and an encapsulation layer TFE disposed on the plurality of light emitting elements ED-1, ED-2, and ED-3.

The plurality of light emitting elements ED-1, ED-2, and ED-3 in an embodiment each includes a first electrode EL1, a second electrode EL2 facing the first electrode EL1, and an emission layer EML disposed between the first electrode EL1 and the second electrode EL2. A hole transport region HTR may be disposed between the first electrode EL1 and the emission layer EML. An electron transport region ETR is disposed between the second electrode EL2 and the emission layer EML. In an embodiment, the plurality of light emitting elements ED-1, ED-2, and ED-3 may emit light from the first electrode EL1 to the second electrode EL2. In the first to third light emitting elements ED-1, ED-2, and ED-3 in an embodiment, with respect to a direction in which light is emitted, a structure in which the hole transport region HTR is disposed below the emission layer EML, and the electron transport region ETR is disposed above the emission layer EML is illustrated as an example, but the invention is not limited thereto, and with respect to a direction in which light is emitted, an inverted element structure in which the electron transport region ETR is disposed below the emission layer EML and the hole transport region HTR is disposed above the emission layer EML may be applied.

FIG. 2A illustrates an embodiment in which the first to third emission layers EML1, EML2, and EML3 of the first to third light emitting elements ED-1, ED-2, and ED-3 are respectively disposed in first to third openings OH1, OH2, and OH3 defined in the pixel defining film PDL, and the first to third hole transport regions HTR1, HTR2, and HTR3, the first to third electron transport regions ETR1, ETR2, and ETR3, and the second electrode EL2 are provided as a common layer throughout the light emitting elements ED-1, ED-2, and ED-3. That is, the first hole transport region HTR1 included in the first light emitting element ED-1, the second hole transport region HTR2 included in the second light emitting element ED-2, and the third hole transport region HTR3 included in the third light emitting element ED-3 each may be partially disposed on the pixel defining film PDL, and the first hole transport region HTR1, the second hole transport region HTR2, and the third hole transport region HTR3 may be unitary with one another on the pixel defining film PDL to form one hole transport region HTR having a single-body shape. In addition, the first electron transport region ETR1 included in the first light emitting element ED-1, the second electron transport region ETR2 included in the second light emitting element ED-2, and the third electron transport region ETR3 included in the third light emitting element ED-3 each may be partially disposed on the pixel defining film PDL, and the first electron transport region ETR1, the second electron transport region ETR2, and the third electron transport region ETR3 may be unitary with one another on the pixel defining film PDL to form one electron transport region ETR having a single-body shape. However, the invention is not limited thereto, and unlike the one in FIGS. 2A and 2B, in an embodiment, the electron transport region ETR and the hole transport region HTR may be provided by being patterned inside the first to third openings OH1, OH2, and OH3 defined in the pixel defining film PDL. In an embodiment, the first to third hole transport regions HTR1, HTR2, and HTR3, the plurality of emission layers EML1, EML2, and EML3, and the first to third electron transport regions ETR1, ETR2, and ETR3, etc., of the plurality of light emitting elements ED-1, ED-2, and ED-3 may be patterned through an inkjet printing method and provided inside the first to third openings OH1, OH2, and OH3, respectively, for example.

In an embodiment, the first emission layer EML1 included in the first light emitting element ED-1 may be disposed in the first opening OH1. In the first light emitting element ED-1 provided with the plurality of first emission layers EML1, the first charge generation layer CGL1 disposed between the first emission layers EML1 may also be disposed in the first opening OH1. The second emission layer EML2 included in the second light emitting element ED-2 may be disposed in the second opening OH2. The third emission layer EML3 included in the third light emitting element ED-3 may be disposed in the third opening OH3. When a plurality of emission layers is provided in each of the second light emitting element ED-2 and the third light emitting element ED-3, the plurality of emission layers and the charge generation layer disposed between the plurality of emission layers each may be disposed in the second opening OH2 and the third opening OH3.

The encapsulation layer TFE may cover the first to third light emitting elements ED-1, ED-2, and ED-3. The encapsulation layer TFE may seal the display element layer DP-ED. The encapsulation layer TFE may be a thin film encapsulation layer. The encapsulation layer TFE may be a single layer or a laminated layer of a plurality of layers. The encapsulation layer TFE includes at least one insulating layer. The encapsulation layer TFE in an embodiment may include at least one inorganic film (hereinafter, an encapsulation inorganic film). In addition, the encapsulation layer TFE in an embodiment may include at least one organic film (hereinafter, an encapsulation organic film) and at least one encapsulation inorganic film.

The encapsulation organic film protects the display element layer DP-ED from moisture/oxygen, and the encapsulation organic film protects the display element layer DP-ED from foreign substances such as dust particles. In an embodiment, the encapsulation inorganic film may include at least one of a silicon nitride layer, a silicon oxy nitride layer, a silicon oxide layer, a titanium oxide layer, an aluminum oxide layer, etc., but is not particularly limited thereto. In an embodiment, the encapsulation organic layer may include at least one of an acrylic-based compound, an epoxy-based compound, etc. In an embodiment, the encapsulation organic layer may include a photopolymerizable compound, but is not particularly limited.

The encapsulation layer TFE may be disposed on the second electrode EL2, and may fill a portion of the first to third openings OH1, OH2, and OH3.

Referring to FIGS. 1 and 2A, the display device DD may include a non-pixel area NPXA and a plurality of pixel areas PXA-R, PXA-G, and PXA-B. The pixel areas PXA-R, PXA-G, and PXA-B each may be an area emitting light generated from each of the plurality of light emitting elements ED-1, ED-2 and ED-3. The plurality of pixel areas PXA-R, PXA-G, and PXA-B may be spaced apart from each other in a plan view.

The plurality of pixel areas PXA-R, PXA-G, and PXA-B each may be an area separated by the pixel defining film PDL. The non-pixel area NPXA may be an area between neighboring pixel areas PXA-R, PXA-G, and PXA-B, and may correspond to the pixel defining film PDL. In the description, the plurality of pixel areas PXA-R, PXA-G, and PXA-B each may correspond to a pixel PX. The pixel defining film PDL may separate the plurality of light emitting elements ED-1, ED-2 and ED-3. The plurality of emission layers EML1-1, EML2, and EML3 of the plurality of light emitting elements ED-1, ED-2, and ED-3 may be separated by being disposed in the first to third openings OH1, OH2, and OH3 defined in the pixel defining film PDL.

The plurality of pixel areas PXA-R, PXA-G, and PXA-B may be divided into a plurality of groups according to colors of light generated from the plurality of light emitting elements ED-1, ED-2, and ED-3. In the display device DD of an embodiment illustrated in FIGS. 1 and 2A, three pixel areas PXA-R, PXA-G, and PXA-B which emit red light, green light, and blue light are illustrated as an example. In an embodiment, the display device DD of an embodiment may include a first pixel area PXA-B, a second pixel area PXA-G, and a third pixel area PXA-R, which are distinct from one another. In an embodiment, the first pixel area PXA-B may be also referred to as a blue pixel area PXA-B, the second pixel area PXA-G may be also referred to as a green pixel area PXA-G, and the third pixel area PXA-R may be also referred to as a red pixel area PXA-R, for example. In the display device DD of an embodiment, one red pixel area PXA-R, one green pixel area PXA-G, and one blue pixel area PXA-B may be collectively referred to as a unit pixel group PXG. Although not shown, at least any one among the red pixel area PXA-R, the green pixel area PXA-G, and the blue pixel area PXA-B included in the unit pixel group PXG may be provided in plural. In an embodiment, the unit pixel group PXG may include two green pixel areas PXA-G, one red pixel area PXA-R, and one blue pixel area PXA-B, for example.

In the display device DD in an embodiment, the first to third light emitting elements ED-1, ED-2, and ED-3 may emit light having different wavelength ranges. In an embodiment, the display device DD may include a first light emitting element ED-1 emitting blue light, a second light emitting element ED-2 emitting green light, and a third light emitting element ED-3 emitting red light, for example. That is, the blue pixel area PXA-B, the green pixel area PXA-G, and the red pixel area PXA-R of the display device DD may correspond to the first light emitting element ED-1, the second light emitting element ED-2, and the third light emitting element ED-3, respectively.

The plurality of pixel areas PXA-R, PXA-G, and PXA-B in the display device DD in an embodiment may be arranged in the form of a stripe. Referring to FIG. 1, a plurality of red pixel areas PXA-R, a plurality of green pixel areas PXA-G, and a plurality of blue pixel areas PXA-B each may be arranged along the second direction DR2. In addition, the red pixel area PXA-R, the green pixel area PXA-G, and the blue pixel area PXA-B may be alternately arranged in turn along the first direction DR1.

FIGS. 1 and 2A illustrate that the pixel areas PXA-R, PXA-G, and PXA-B are all similar in size, but the invention is not limited thereto, and the pixel areas PXA-R, PXA-G and PXA-B may be different in size from one another according to wavelength ranges of emitted light. The area of the pixel areas PXA-R, PXA-G, and PXA-B may refer to areas in a plan view defined by the first direction DR1 and the second direction DR2.

The arrangement of the pixel areas PXA-R, PXA-G, and PXA-B is not limited to the one shown in FIG. 1, and the order that the red pixel area PXA-R, the green pixel area PXA-G, and the blue pixel area PXA-B are arranged comes with varied combination according to display quality characteristics desired for the display device DD. In an embodiment, the pixel areas PXA-R, PXA-G, and PXA-B may be arranged in the form of a pentile or a diamond, for example.

The display device DD of an embodiment may include a base substrate BL and a polarizing layer POL disposed on the display panel DP. However, the invention is not limited thereto.

The base substrate BL may be a glass substrate, a metal substrate, a plastic substrate, etc. The base substrate BL may be a member providing a base surface on which the polarizing layer POL, etc., is disposed.

The display device DD of an embodiment may further include the polarizing layer POL. The polarizing layer POL may block external light incident on the display device from the outside. The polarizing layer POL may block some external light. In addition, the polarizing layer POL may reduce reflected light generated in the display panel DP due to external light. That is, the polarizing layer POL may be an anti-reflection layer. In an embodiment, the polarizing layer POL may function to block reflected light of a case where light incident from the outside the display device DD is incident on the display panel DP and exits again, for example.

FIG. 2A illustrates that the polarizing layer POL is exposed by being disposed on the base substrate BL, but the invention is not limited thereto. In an embodiment, the polarizing layer POL may be disposed below the base substrate BL, for example.

FIG. 2A illustrates, as an example, that the display device DD includes the polarizing layer POL, but the invention is not limited thereto, and the polarizing layer POL may be omitted. In an embodiment, as shown in FIG. 2B, in an embodiment, a display device DD-1 may not include a polarizing layer, and may include a color filter layer CFL as an anti-reflection layer, for example. The color filter layer CFL may include color filter units CF-R, CF-G, and CF-B corresponding to each of the red pixel area PXA-R, the green pixel area PXA-G, and the blue pixel areas PXA-B. The color filter layer CFL may include a red color filter unit CF-R overlapping the red pixel area PXA-R, a green color filter unit CF-G overlapping the green pixel area PXA-G, and a blue color filter unit CF-B overlapping the blue pixel area PXA-B. The color filter layer CFL may include a light blocking unit BM overlapping the non-pixel areas NPXA and disposed between the color filter units CF-R, CF-G, and CF-B.

Figure 3:
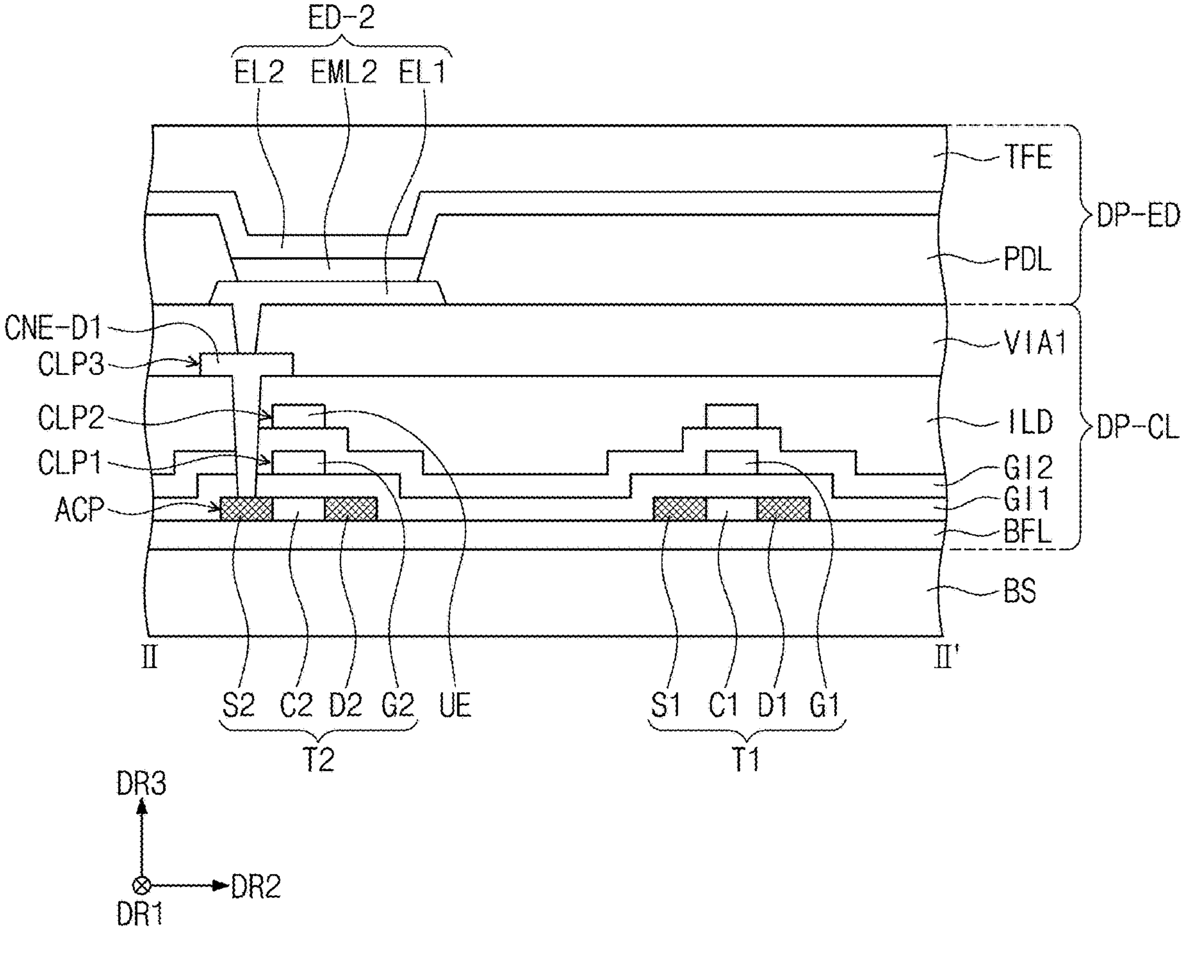
FIG. 3 is a cross-sectional view of an embodiment of a display device according to the invention.

FIG. 3 is a cross-sectional view of an embodiment of a display device according to the invention. FIG. 3 is a cross-sectional view showing a portion corresponding to line II-II' of FIG. 1.

Referring to FIG. 3, the circuit layer DP-CL of the display device DD may include a buffer layer BFL, a first gate insulating layer GI1, a second gate insulating layer GI2, an interlayer insulating layer ILD, an upper insulating layer VIA1, a semiconductor pattern ACP including a plurality of patterns, a first conductive layer CLP1 including a plurality of patterns, a second conductive layer CLP2 including a plurality of patterns, and a third conductive layer CLP3 including a plurality of patterns. In this case, the first conductive layer CLP1 may include a first gate metal pattern, the second conductive layer CLP2 may include a second gate metal pattern, and the third conductive layer CLP3 may include a first data metal pattern.

In an embodiment of the invention, the first gate insulating layer GI1, the second gate insulating layer GI2, and the interlayer insulating layer ILD each include an organic layer and/or an inorganic layer. In an embodiment of the invention, the first gate insulating layer GI1, the second gate insulating layer GI2, and the insulating layer ILD each may include a plurality of inorganic thin films. The plurality of inorganic thin films may include a silicon nitride layer and a silicon oxide layer. In an embodiment of the invention, the first conductive layer CLP1 and the second conductive layer CLP2 each may include molybdenum (Mo), but are not limited thereto.

In an embodiment of the invention, the third conductive layer CLP3 may include at least any one of aluminum (Al) or titanium (Ti), but is not limited thereto. In an embodiment of the invention, the third conductive layer CLP3 may have a structure in which titanium, aluminum, and titanium are sequentially stacked.

The buffer layer BFL may be disposed on the base layer BS. The buffer layer BFL may include a first buffer layer and a second buffer layer. The second buffer layer may be disposed on the first buffer layer. The buffer layer BFL prevents impurities provided in the base layer BS from being introduced into the pixel PX. In particular, the buffer layer BFL prevents impurities from diffusing into the semiconductor pattern ACP of transistors T1 and T2 forming the pixel PX.

Impurities may be introduced from the outside or may be generated through thermal decomposition of the base layer BS. Impurities may be gas or sodium discharged from the base layer BS. In addition, the buffer layer BFL may block moisture introduced into the pixel PX from the outside.

The semiconductor pattern ACP is disposed on the buffer layer BFL. In an embodiment of the invention, the semiconductor pattern ACP may be disposed on the buffer layer BFL.

The semiconductor pattern ACP may constitute each of the transistors T1 and T2. The semiconductor pattern ACP may include polysilicon, amorphous silicon, or a metal oxide semiconductor. FIG. 3 illustrates a semiconductor pattern constituting a source S1, an active C1, and a drain D1 of the first transistor T1, and a semiconductor pattern constituting a source S2, an active C2, and a drain D2 of the second transistor T2.

The first gate insulating layer GI1 may be disposed on the buffer layer BFL and may cover the semiconductor pattern ACP. The first conductive layer CLP1 may be disposed on the first gate insulating layer GI1. A gate G1 of the first transistor T1 and a gate G2 of the second transistor T2 are shown in the first conductive layer CLP1. Although not shown separately, in an embodiment of the invention, the first conductive layer CLP1 may include any one of two electrodes constituting a capacitor of the pixel PX.

The second gate insulating layer GI2 may be disposed on the first gate insulating layer GI1 and may cover the first conductive layer CLP1. The second conductive layer CLP2 may be disposed on the second gate insulating layer GI2. In an embodiment of the invention, the second conductive layer CLP2 may be the other one of the two electrodes constituting the capacitor CP of the pixel PX. An upper electrode UE is shown as the second conductive layer CLP2. An opening may be defined in the upper electrode UE.

The interlayer insulating layer ILD may be disposed on the second gate insulating layer GI2 and may cover the second conductive layer CLP2. A first connection electrode CNE-D1 of the third conductive layer CLP3 may be connected to the source S2 of the second transistor T2. The upper insulating layer VIA1 may be disposed on the interlayer insulating layer ILD, and may cover the third conductive layer CLP3.

As shown in FIG. 3, the display element layer DP-ED may include the second light emitting element ED-2 and the pixel defining film PDL. The second light emitting element ED-2 may include a first electrode EL1, a second emission layer EML2, and a second electrode EL2. In FIG. 3, only the first electrode EL1, the second emission layer EML2, and the second electrode EL2, which are some of the components included in the second light emitting element ED-2, are illustrated, and a hole transport region and an electron transport region are omitted.

The first electrode EL1 may be disposed on the upper insulating layer VIAL The first electrode EL1 may be electrically connected to at least any one of the transistors T1 to T2 through a contact hole. The first electrode ELL for example, may be connected to the first connection electrode CNE-D1 through a contact hole, and may be electrically connected to the second transistor T2. In an embodiment of the invention, the plurality of transistors T1 and T2 each may be a p-channel metal-oxide-semiconductor ("PMOS") transistor or an n-channel metal-oxide-semiconductor ("NMOS") transistor.

The pixel defining film PDL may be disposed on the upper insulating layer VIA1, and may expose at least a portion of the first electrode EL1. The second emission layer EML2 may be disposed on the first electrode EL1. The second electrode EL2 may be disposed on the second emission layer EML2.

When the second light emitting element ED-2 is an organic light emitting diode ("OLED"), the second emission layer EML2 may include an organic material. The encapsulation layer TFE may seal the second light emitting element ED-2 to protect the second light emitting element ED-2 from external oxygen or moisture. The encapsulation layer TFE may be a layer in which an organic layer and an inorganic layer are mixed.

Figure 4A:
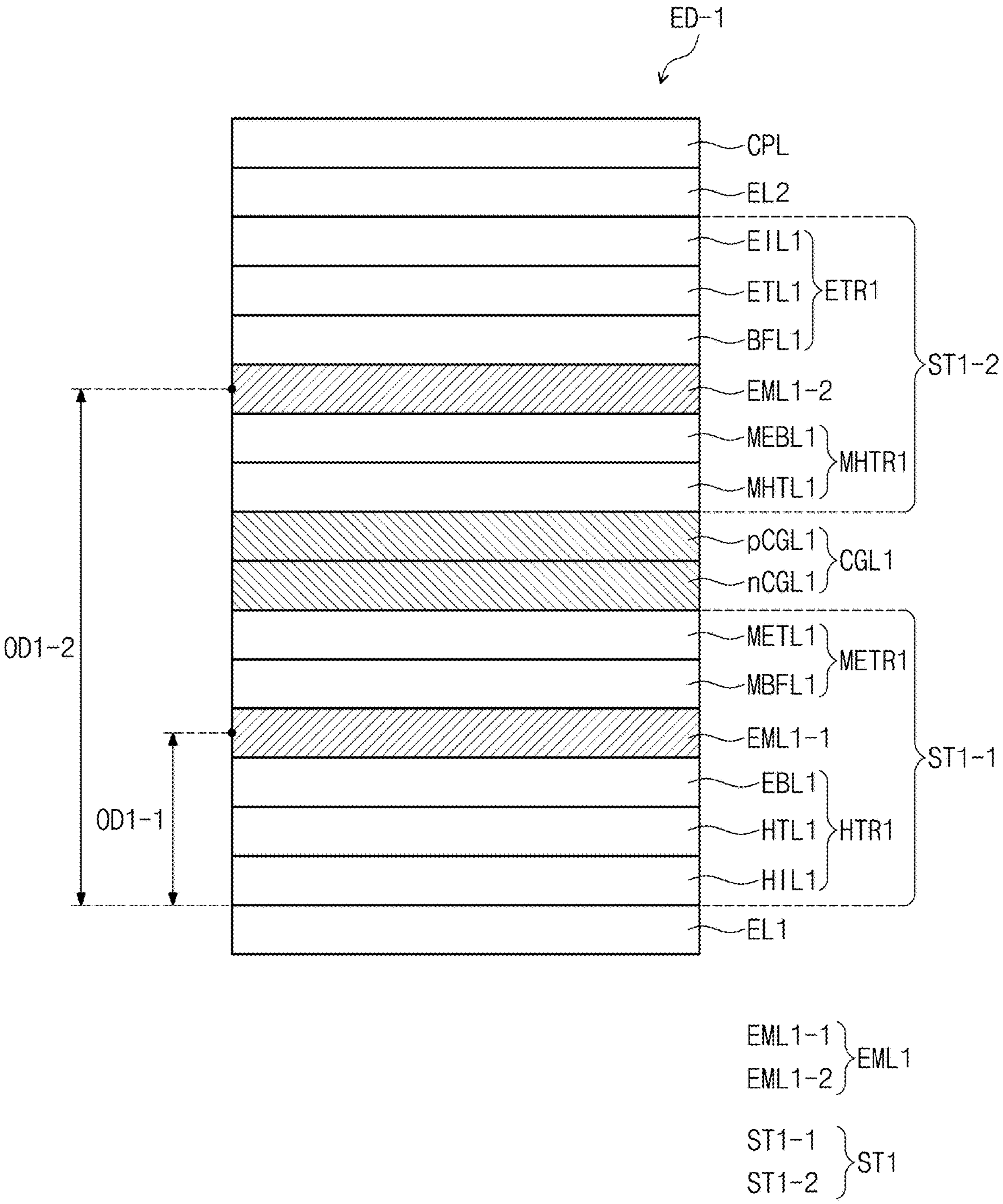
FIGS. 4A to 4C are schematic cross-sectional views of an embodiment of a light emitting element according to the invention.
Figure 4B:
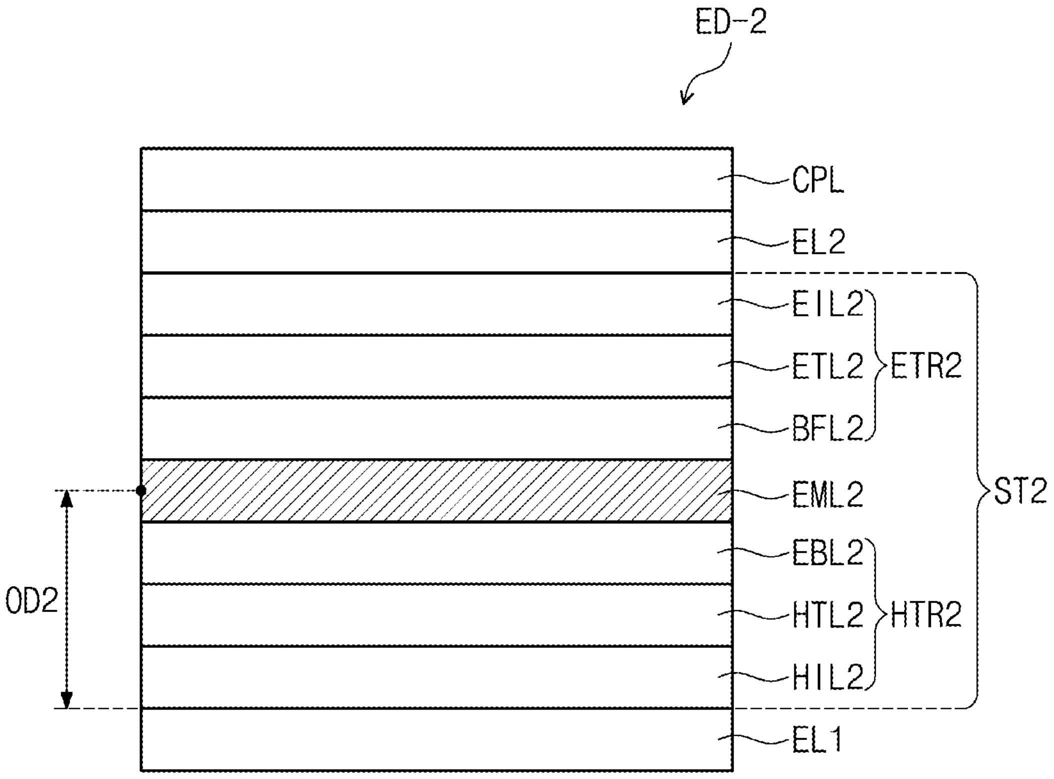
Figure 4C:
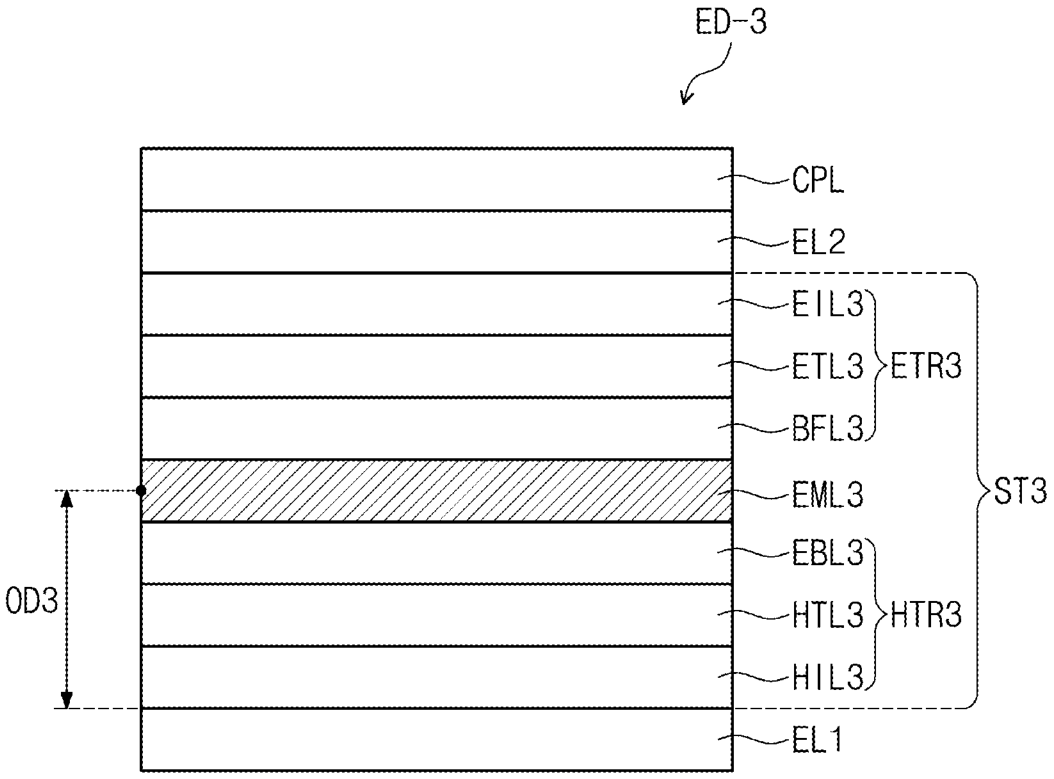

FIGS. 4A to 4C are schematic cross-sectional views of an embodiment of a light emitting element according to the invention. FIG. 4A illustrates a cross-section of the first light emitting element ED-1 shown in FIGS. 2A and 2B, FIG. 4B illustrates a cross-section of the second light emitting element ED-2 shown in FIGS. 2A and 2B, and FIG. 4C illustrates a schematic cross-section of the third light emitting element ED-3 shown in FIGS. 2A and 2B.

Referring to FIG. 4A, the first light emitting element ED-1 in an embodiment includes a first electrode ELL a second electrode EL2 facing the first electrode EL1, and a plurality of first light emitting unit structures ST1-1 and ST1-2 disposed between the first electrode EL1 and the second electrode EL2. The first light emitting element ED-1 in an embodiment may include an 1-1st light emitting unit structure ST1-1 and a 1-2nd light emitting unit structure ST1-2 disposed between the first electrode EL1 and the second electrode EL2, and a first charge generation layer CGL1 disposed between the 1-1st light emitting unit structure ST1-1 and the 1-2nd light emitting unit structure ST1-2.

The 1-1st light emitting unit structure ST1-1 and the 1-2nd light emitting unit structure ST1-2 each include a first emission layer EML1 emitting first light. The 1-1st light emitting unit structure ST1-1 may include an 1-1st sub-emission layer EML1-1 emitting first light, a first hole transport region HTR1 transporting holes provided from the first electrode EL1 to the 1-1st sub-emission layer EML1-1, and a first intermediate electron transport region METR1 transporting electrons generated from the first charge generation layer CGL1 to the 1-1st sub-emission layer EML1-1. The 1-2nd light emitting unit structure ST1-2 may include a 2-1st sub-emission layer EML1-2 emitting first light, a first intermediate hole transport region MHTR1 transporting holes generated from the first charge generation layer CGL1 to the 2-1st sub-emission layer EML1-2, and a first electron transport region ETR1 transporting electrons provided from the second electrode EL2 to the 2-1st sub-emission layer EML1-2.

The first hole transport region HTR1 may include a first hole injection layer HIL1 disposed on the first electrode EL1, a first hole transport layer HTL1 disposed on the first hole injection layer HILL and a first hole side additional layer EBL1 disposed on the first hole transport layer HTL1. The first hole side additional layer EBL1 may include at least one among a hole buffer layer, a light emitting auxiliary layer, and an electron blocking layer. The hole buffer layer may be a layer compensating a resonance distance according to wavelengths of light emitted from an emission layer, and may thus increase light emission efficiency. The electron blocking layer may be a layer serving to prevent electrons from being injected from an electron transport region to a hole transport region. The first hole side additional layer EBL1 may contact the 1-1st sub-emission layer EML1-1. However, the invention is not limited thereto, and the first hole side additional layer EBL1 may be omitted, and the first hole transport layer HTL1 may contact the 1-1st sub-emission layer EML1-1.

The first intermediate electron transport region METR1 may include a first intermediate electron side additional layer MBFL1 disposed on the 1-1st sub-emission layer EML1-1, and a first intermediate electron transport layer METL1 disposed on the first intermediate electron side additional layer MBFL1. The first intermediate electron side additional layer MBFL1 may include at least one of an electron buffer layer or a hole blocking layer. The first intermediate electron side additional layer MBFL1 may contact the 1-1st sub-emission layer EML1-1. However, the invention is not limited thereto, and the first intermediate electron side additional layer MBFL1 may be omitted. In an embodiment, a first intermediate electron injection layer may be disposed between the first intermediate electron transport layer METL1 and the first charge generation layer CGL1.

The first intermediate hole transport region MHTR1 may include a first intermediate hole transport layer MHTL1 disposed on the first charge generation layer CGL1, and a first intermediate hole side additional layer MEBL1 disposed on the first intermediate hole transport layer MHTL1. The first intermediate hole side additional layer MEBL1 may include at least one among a hole buffer layer, a light emitting auxiliary layer, and an electron blocking layer. The first intermediate hole side additional layer MEBL1 may contact the 2-1st sub-emission layer EML1-2. However, the invention is not limited thereto, and the first intermediate hole side additional layer MEBL1 may be omitted, and the first intermediate hole transport layer MHTL1 may contact the 2-1st sub-emission layer EML1-2. In an embodiment, a first intermediate hole injection layer may be disposed between the first charge generation layer CGL1 and the first intermediate hole transport layer MHTL1.

The first electron transport region ETR1 may include a first electron side additional layer BFL1 disposed on the 2-1st sub-emission layer EML1-2, a first electron transport layer ETL1 disposed on the first electron side additional layer BFL1, and a first electron injection layer EIL1 disposed on the first electron transport layer ETL1. The first electron side additional layer BFL1 may include at least one of an electron buffer layer or a hole blocking layer. The first electron side additional layer BFL1 may contact the 2-1st sub-emission layer EML1-2. However, the invention is not limited thereto, and the first electron side additional layer BFL1 may be omitted, and the first electron transport layer ETL1 may contact the 2-1st sub-emission layer EML1-2.

The first charge generation layer CGL1 may be provided between the 1-1st light emitting unit structure ST1-1 and the 1-2nd light emitting unit structure ST1-2. When voltages are applied to the first charge generation layer CGL1, a complex is provided through an oxidation-reduction reaction to generate charges (electrons and holes). In addition, the first charge generation layer CGL1 may provide the generated charges to each of the adjacent light emitting unit structures ST1-1 and ST1-2. The first charge generation layer CGL1 may double the current efficiency generated in one light emitting unit structure ST1-1 and ST1-2, and may serve to control the balance of charges between the 1-1st light emitting unit structure ST1-1 and the 1-2nd light emitting unit structure ST1-2.

The first charge generation layer CGL1 may have a layer structure in which a first sub charge generation layer nCGL1 and a second sub charge generation layer pCGL1 are bonded to each other. In an embodiment, the first sub charge generation layer nCGL1 may be an n-type charge generation layer disposed adjacent to the first light emitting unit structure ST1 to provide electrons to the 1-1st light emitting unit structure ST1-1, for example. In an embodiment, the second sub charge generation layer pCGL1 may be a p-type charge generation layer disposed adjacent to the 1-2nd light emitting unit structure ST1-2 to provide holes to the 1-2nd light emitting unit structure ST1-2, for example. Although not shown, a buffer layer may be further disposed between the first sub charge generation layer nCGL1 and the second sub charge generation layer pCGL1.

The first charge generation layer CGL1 may include an n-type aryl amine-based material or a p-type metal oxide. In an embodiment, the first charge generation layer CGL1 may include a charge generation compound composed of an aryl amine-based organic compound, a metal, a metal oxide, a metal carbide, a metal fluoride, or a combination thereof, for example.

In an embodiment, the aryl amine-based organic compound may be N, N'-Bis(naphthalen-1-yl)-N,N'-bis(phenyl)-2,2-dimethylbenzidine ("α-NPD"), 4,4',4"-tris{N,-(2-naphthyl)-N-phenylamino)-triphenylamine ("2-TNATA"), 4,4',4"-tris(N,N-diphenylamino)triphenylamine ("TDATA"), 4,4',4"-tris(3-methylphenylphenylamino)-triphenylamine ("MTDATA"), 2,2',7,7'-Tetrakis(N,N-diphenylamino)-9,9-spirobifluorene ("sprio-TAD"), or N,N'-bis(naphthalen-1-yl)-N,N'-bis(phenyl)-9,9-spirobifluorene ("sprio-NPB"), for example. In an embodiment, the metal may be cesium (Cs), molybdenum (Mo), vanadium (V), titanium (Ti), tungsten (W), barium (Ba), or lithium (Li), for example. In an embodiment, a metal oxide, a metal carbide, and a metal fluoride may be $Re_2O_7$, $MoO_3$, $V_2O_5$, $WO_3$, $TiO_2$, $Cs_2CO_3$, BaF, LiF, or CsF, for example.

Referring to FIG. 4B, the second light emitting element ED-2 in an embodiment includes a first electrode EL1, a second electrode EL2 facing the first electrode EL1, and a second light emitting unit structure ST2 disposed between the first electrode EL1 and the second electrode EL2.

The second light emitting unit structure ST2 includes a second emission layer EML2 emitting second light. The second light emitting unit structure ST2 may include a second emission layer EML2 emitting second light, a second hole transport region HTR2 transporting holes provided from the first electrode EL1 to the second emission layer EML2, and a second electron transport region ETR2 transporting electrons provided from the second electrode EL2 to the second emission layer EML2.

The second hole transport region HTR2 may include a second hole injection layer HIL2 disposed on the first electrode EL1, a second hole transport layer HTL2 disposed on the second hole injection layer HIL2, and a second hole side additional layer EBL2 disposed on the second hole transport layer HTL2. The second hole side additional layer EBL2 may include at least one among a hole buffer layer, a light emitting auxiliary layer, and an electron blocking layer. The second hole side additional layer EBL2 may contact the second emission layer EML2. However, the invention is not limited thereto, and the second hole side additional layer EBL2 may be omitted, and the second hole transport layer HTL2 may contact the second emission layer EML2.

The second electron transport region ETR2 may include a second electron side additional layer BFL2 disposed on the second emission layer EML2, a second electron transport layer ETL2 disposed on the second electron side additional layer BFL2, and a second electron injection layer EIL2 disposed on the second electron transport layer ETL2. The second electron side additional layer BFL2 may include at least one of an electron buffer layer or a hole blocking layer. The second electron side additional layer BFL2 may contact the second emission layer EML2. However, the invention is not limited thereto, and the second electron side additional layer BFL2 may be omitted, and the second electron transport layer ETL2 may contact the second emission layer EML2.

Referring to FIG. 4C, the third light emitting element ED-3 in an embodiment includes a first electrode EL1, a second electrode EL2 facing the first electrode EL1, and a third light emitting unit structure ST3 disposed between the first electrode EL1 and the second electrode EL2.

The third light emitting unit structure ST3 includes a third emission layer EML3 emitting third light. The third light emitting unit structure ST3 may include a third emission layer EML3 emitting third light, a third hole transport region HTR3 transporting holes provided from the first electrode EL1 to the third emission layer EML3, and a third electron transport region ETR3 transporting electrons provided from the second electrode EL2 to the third emission layer EML3.

The third hole transport region HTR3 may include a third hole injection layer HIL3 disposed on the first electrode EL1, a third hole transport layer HTL3 disposed on the third hole injection layer HIL3, and a third hole side additional layer EBL3 disposed on the third hole transport layer HTL3. The third hole side additional layer EBL3 may include at least one among a hole buffer layer, a light emitting auxiliary layer, and an electron blocking layer. The third hole side additional layer EBL3 may contact the third emission layer EML3. However, the invention is not limited thereto, and the third hole side additional layer EBL3 may be omitted, and the third hole transport layer HTL3 may contact the third emission layer EML3.

The third electron transport region ETR3 may include a third electron side additional layer BFL3 disposed on the third emission layer EML3, a third electron transport layer ETL3 disposed on the third electron side additional layer BFL3, and a third electron injection layer EIL3 disposed on the third electron transport layer ETL3. The third electron side additional layer BFL3 may include at least one of an electron buffer layer or a hole blocking layer. The third electron side additional layer BFL3 may contact the third emission layer EML3. However, the invention is not limited thereto, and the third electron side additional layer BFL3 may be omitted, and the third electron transport layer ETL3 may contact the third emission layer EML3.

In the first to third light emitting elements ED-1, ED-2, and ED-3 in an embodiment, the first electrode EL1 has conductivity. The first electrode EL1 may include a metal material, a metal alloy or a conductive compound. The first electrode EL1 may be an anode or a cathode. However, the invention is not limited thereto. In addition, the first electrode EL1 may be a pixel electrode.

In the first to third light emitting elements ED-1, ED-2, and ED-3 in an embodiment, the first electrode EL1 may be a reflective electrode. In an embodiment, the first electrode EL1 may include Ag, Mg, Cu, Al, Pt, Pd, Au, Ni, Nd, Ir, Cr, Li, Ca, LiF/Ca, LiF/Al, Mo, Ti, W, which have a high reflectance, or a compound thereof or a combination thereof (e.g., a combination of Ag and Mg), for example. In an alternative embodiment, the first electrode EL1 may have a multilayer structure including a reflective film including the above-described materials, and a transparent conductive film including at least one of indium tin oxide ("ITO"), indium zinc oxide ("IZO"), zinc oxide (ZnO), indium tin zinc oxide ("ITZO"), etc. In an embodiment, the first electrode EL1 may have a two-layer structure of ITO/Ag and/or a three-layer structure of ITO/Ag/ITO, for example, but is not limited thereto. In addition, the invention is not limited thereto, and the first electrode EL1 may include the above-described metal materials, a combination of at least two metal materials selected from the above-described metal materials, or oxides of the above-described metal materials. In an embodiment, the first electrode EL1 may have a thickness of about 700 angstroms (Å) to about 10000 Å, for example. In an embodiment, the first electrode EL1 may have a thickness of about 1000 Å to about 3000 Å, for example.

In the first to third light emitting elements ED-1, ED-2, and ED-3 in an embodiment, the first to third hole transport regions HTR1, HTR2, and HTR3 are disposed on the first electrode EL1. In the first light emitting element ED-1 provided with a plurality of emission layers, a first intermediate hole transport region MHTR1 is disposed on the first charge generation layer CGL1.

The first to third hole transport regions HTR1, HTR2, and HTR3 and the first intermediate hole transport region MHTR1 may have a single layer including a single material, a single layer including a plurality of different materials, or a multi-layer structure including a plurality of layers including a plurality of different materials.

In an embodiment, the first to third hole transport regions HTR1, HTR2, and HTR3 and the first intermediate hole transport region MHTR1 each may be provided using various methods such as a vacuum deposition method, a spin coating method, a cast method, a Langmuir-Blodgett ("LB") method, an inkjet printing method, a laser printing method, a laser induced thermal imaging ("LITI") method, etc.

In an embodiment, the first to third hole transport regions HTR1, HTR2, and HTR3 and the first intermediate hole transport region MHTR1 each may include at least one of a phthalocyanine compound such as copper phthalocyanine, N,N'-diphenyl-N,N'-bis-[4-(phenyl-m-tolyl-amino)-phenyl]-biphenyl-4,4'-diamine ("DNTPD"), 4,4',4"-[tris(3-methylphenyl)phenylamino]triphenylamine] ("m-MTDATA"), TDATA, 2-TNATA, poly(3,4-ethylenedioxythiophene)/poly(4-styrenesulfonate) ("PEDOT/PSS"), polyaniline/dodecylbenzenesulfonic acid ("PANI/DBSA"), polyaniline/camphor sulfonic acid ("PANI/CSA"), polyaniline/poly(4-styrenesulfonate) ("PANI/PSS"), N,N'-di(naphthalene-1-yl)-N,N'-diphenyl-benzidine ("NPB"), triphenylamine-containing polyetherketone ("TPAPEK"), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile ("HAT-CN"), etc.

In an embodiment, the first to third hole transport regions HTR1, HTR2, and HTR3 and the first intermediate hole transport region MHTR1 each may include at least one of carbazole-based derivatives such as N-phenyl carbazole and polyvinyl carbazole, fluorine-based derivatives, N,N'-bis(3-methylphenyl)-N,N'-diphenyl-[1,1-biphenyl]-4,4'-diamine ("TPD"), triphenylamine-based derivatives such as 4,4',4"-tris(N-carbazolyl)triphenylamine ("TCTA"), 4,4'-cyclohexylidene bis[N,N-bis(4-methylphenyl]benzenamine] ("TAPC"), 4,4'-bis[N,N'-(3-tolyl)amino]-3,3'-dimethylbiphenyl ("HMTPD"), 1,3-bis(N-carbazolyl)benzene ("mCP"), etc.

In an embodiment, the first to third hole transport regions HTR1, HTR2, and HTR3 and the first intermediate hole transport region MHTR1 each may include at least one of 9-(4-tert-Butylphenyl)-3,6-bis(triphenylsilyl)-9H-carbazole (CzSi), 9-phenyl-9H-3,9'-bicarbazole ("CCP"), mCP, 1,3-bis(1,8-dimethyl-9H-carbazol-9-yl)benzene ("mDCP"), etc.

The first to third hole transport regions HTR1, HTR2, and HTR3 may include the compounds of the hole transport region described above in at least one among the first to third hole injection layers HILL HIL2, and HIL3, the first to third hole transport layers HTL1, HT2L, and HTL3, and the first to third hole side additional layers EBL1, EBL2, and EBL3. The first intermediate hole transport region MHTR1 may include the compounds of the hole transport region described above in at least one of the first intermediate hole transport layer MHTL1 or the first intermediate hole side additional layer MEBL1.

In an embodiment, the first to third hole transport regions HTR1, HTR2, and HTR3 and the first intermediate hole transport region MHTR1 each may have a thickness of about 100 Å to about 10000 Å, for example, about 100 Å to about 5000 Å, for example. In an embodiment, when the first to third hole transport regions HTR1, HTR2, and HTR3 include the first to third hole injection layers HILL HIL2, and HIL3, the first to third hole injection layers HILL HIL2, and HIL3 may have a thickness of, for example, about 30 Å to about 1000 Å, for example. In an embodiment, when the first to third hole transport regions HTR1, HTR2, and HTR3 include the first to third hole transport layers HTL1, HTL2, and HTL3, the first to third hole transport layers HTL1, HTL2, and HTL3 may have a thickness of about 30 Å to about 1000 Å, for example. In an embodiment, when the first to third hole transport regions HTR1, HTR2, and HTR3 include the first to third hole side additional layers EBL1, EBL2, and EBL3, the first to third hole side additional layers EBL1, EBL2, and EBL3 may have a thickness of about 10 Å to about 1000 Å, for example. In an embodiment, the first intermediate hole transport layer MHTL1 included in the first intermediate hole transport region MHTR1 may have a thickness of about 30 Å to about 1000 Å, for example. In an embodiment, the first intermediate hole side additional layer MEBL1 included in the first intermediate hole transport region MHTR1 may have a thickness of about 10 Å to about 1000 Å, for example. When the thicknesses of the first to third hole transport regions HTR1, HTR2, and HTR3, the first intermediate hole transport region MHTR1, and each layer included therein satisfy the above-described range, satisfactory hole transport properties may be obtained without a substantial increase in driving voltage.

The first to third hole transport regions HTR1, HTR2, and HTR3 and the first intermediate hole transport region MHTR1 may further include, in addition to the above-described materials, a charge generation material to increase conductivity. The charge generation material may be uniformly or non-uniformly dispersed in the first to third hole transport regions HTR1, HTR2, and HTR3 and the first intermediate hole transport region MHTR1. The charge generation material may be, for example, a p-dopant. The p-dopant may include at least one of halogenated metal compounds, quinone derivatives, metal oxides, or cyano group-containing compounds, but is not limited thereto. In an embodiment, the p-dopant may include halogenated metal compounds such as CuI and RbI, quinone derivatives such as tetracyanoquinodimethane ("TCNQ") and 2,3,5,6-tetrafluoro-7,7,8,8-tetracyanoquinodimethane ("F4-TCNQ"), metal oxides such as tungsten oxides and molybdenum oxides, etc., for example, but is not limited thereto.

The first to third emission layers EML1, EML2, and EML3 are provided on the first to third hole transport regions HTR1, HTR2, and HTR3 or the first intermediate hole transport region MHTR1. The 1-1st sub-emission layer EML1-1, the second emission layer EML2, and the third emission layer EML3 are provided on the first to third hole transport regions HTR1, HTR2, and HTR3, and the 2-1st sub-emission layer EML1-2 is provided on the first intermediate hole transport region MHTR1.

In an embodiment, the first to third emission layers EML1, EML2, and EML3 may have, for example, a thickness of about 100 Å to about 1000 Å or about 100 Å to about 300 Å, for example. The first to third emission layers EML1, EML2, and EML3 may have a single layer including a single material, a single layer including a plurality of different materials, or a multilayer structure having a plurality of layers including a plurality of different materials.

In the first to third light emitting elements ED-1, ED-2, and ED-3 of an embodiment, the first to third emission layers EML1, EML2, and EML3 may include an anthracene derivative, a pyrene derivative, a fluoranthene derivative, a chrysene derivative, a dihydrobenzanthracene derivative, or a triphenylene derivative. To be specific, the first to third emission layers EML1, EML2, and EML3 may include an anthracene derivative or a pyrene derivative.

In an embodiment, the first to third emission layers EML1, EML2, and EML3 may further include a general material known in the art as a host material. In an embodiment, the emission layer EML may include, as a host material, at least one among bis[2-(diphenylphosphino)phenyl]ether oxide ("DPEPO"), 4,4'-bis(N-carbazolyl)-1,1'-biphenyl ("CBP"), 1,3-bis(carbazolyl-9-yl)benzene ("mCP"), 2,8-bis(diphenylphosphoryl)dibenzofuran ("PPF"), 4,4',4"-tris(carbazol-9-yl)-triphenylamine ("TCTA"), and 1,3,5-tris(1-phenyl-1H-benzo[d]imidazol-2-yl) benzene ("TPBi"), for example. However, the invention is not limited thereto, and for example, at least one of tris(8-hydroxyquinolino) aluminum ($Alq_3$), poly(N-vinylcarbazole) ("PVK"), 9,10-di(naphthalene-2-yl)anthracene ("ADN"), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), 2-methyl-9,10-bis(naphthalen-2-yl)anthracene ("MADN"), hexaphenyl cyclotriphosphazene ("CP1"), 1,4-bis(triphenylsilyl)benzene ("UGH2"), hexaphenylcyclotrisiloxane ($DPSiO_3$), octaphenylcyclotetrasiloxane ($DPSiO_4$), etc., may be used as a host material.

In an embodiment, the first to third emission layers EML1, EML2, and EML3 may include, as a known dopant material, at least one of styryl derivatives (e.g., 1,4-bis[2-(3-N-ethylcarbazoryl)vinyl]benzene ("BCzVB"), 4-(di-p-tolylamino)-4"-[(di-p-tolylamino)styryl]stilbene ("DPAVB"), and N-(4-((E)-2-(6-((E)-4-(diphenylamino)styryl)naphthalen-2-yl)vinyl)phenyl)-N-phenylbenzenamine ("N-BDAVBi"), perylene and derivatives thereof (e.g., 2,5,8,11-tetra-t-butylperylene ("TBP")), pyrene and derivatives thereof (e.g., 1,1-dipyrene, 1,4-dipyrenylbenzene, 1,4-bis(N,N-diphenylamino)pyrene), etc.

The first to third emission layers EML1, EML2, and EML3 may include a known phosphorescent dopant material. In an embodiment, as a phosphorescent dopant, a metal complex including at least one of iridium (Ir), platinum (Pt), osmium (Os), gold (Au), titanium (Ti), zirconium (Zr), hafnium (Hf), europium (Eu), and terbium (Tb), or thulium (Tm) may be used, for example. In the embodiment, iridium (III) bis(4,6-difluorophenylpyridinato-N,C2')picolinate ("FIrpic"), bis(2,4-difluorophenylpyridinato)-tetrakis(1-pyrazolyl)borate iridium(III) ("Fir6"), platinum octaethyl porphyrin ("PtOEP"), etc., may be used as a phosphorescent dopant, for example. However, the invention is not limited thereto.

The first emission layer EML1 emits first light. The second emission layer EML2 emits second light. The third emission layer EML3 emits third light. In the first to third light emitting elements ED-1, ED-2, and ED-3 in an embodiment, the first to third light may be light having substantially different wavelength ranges. In an embodiment, the first light may be blue light having a wavelength range of about 410 nanometers (nm) to about 480 nm, for example. In an embodiment, the second light may be green light having a wavelength range of about 500 nm to about 570 nm, for example. In an embodiment, the third light may be red light having a wavelength range of about 625 nm to about 675 nm, for example.

The first to third electron transport regions ETR1, ETR2, and ETR3 and the first intermediate electron transport region METR1 are disposed on the first to third emission layers EML1, EML2, and EML3. In the first light emitting element ED-1 provided with a plurality of emission layers, the first intermediate electron transport region METR1 may be disposed between the 1-1st sub-emission layer EML1-1 and the first charge generation layer CGL1, and the first electron transport region ETR1 may be disposed between the 2-1st sub-emission layer EML1-2 and the second electrode EL2. The first to third electron transport regions ETR1, ETR2, and ETR3 and the first intermediate electron transport region METR1 each may have a single layer including a single material, a single layer including a plurality of different materials, or a multi-layer structure including a plurality of layers including a plurality of different materials.

The first to third electron transport regions ETR1, ETR2, and ETR3 and the first intermediate electron transport region METR1 each may be provided using various methods such as a vacuum deposition method, a spin coating method, a cast method, an LB method, an inkjet printing method, a laser printing method, an LITI method, etc.

The first to third electron transport regions ETR1, ETR2, and ETR3 and the first intermediate electron transport region METR1 each may include an anthracene-based compound. However, the invention is not limited thereto, and the first to third electron transport regions ETR1, ETR2, and ETR3 and the first intermediate electron transport region METR1 each may include, for example, at least one of tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi, 2,9-dimethyl-4,7-diphenyl-1,10-phenanthroline ("BCP"), 4,7-diphenyl-1,10-phenanthroline ("Bphen"), 3-(4-biphenylyl)-4-phenyl-5-tert-butylphenyl-1,2,4-triazole ("TAZ"), 4-(naphthalen-1-yl)-3,5-diphenyl-4H-1,2,4-triazole ("NTAZ"), 2-(4-biphenylyl)-5-(4-tert-butylphenyl)-1,3,4-oxadiazole ("tBu-PBD"), bis(2-methyl-8-quinolinolato-N1,O8)-(1,1'-biphenyl-4-olato)aluminum ("BAlq"), berylliumbis(benzoquinolin-10-olate ($Bebq_2$), ADN, or a combination thereof.

In addition, the first to third electron transport regions ETR1, ETR2, and ETR3 and the first intermediate electron transport region METR1 each may include halogenated metals such as LiF, NaCl, CsF, RbCl, RbI, CuI, and KI, lanthanide metals such as Yb, or co-deposition materials of a halogenated metal and a lanthanide metal. In an embodiment, the first to third electron transport regions ETR1, ETR2, and ETR3 may include KI:Yb, RbI:Yb, etc., as a co-deposition material, for example. For the first to third electron transport regions ETR1, ETR2, and ETR3, a metal oxide such as $Li_2O$ and BaO, or 8-hydroxyl-lithium quinolate (Liq), etc., may be used, but the embodiment of the invention is limited thereto. The first to third electron transport regions ETR1, ETR2, and ETR3 may also include a combination material of an electron transport material and an insulating organo-metal salt. In an embodiment, the organo-metal salt may be a material having an energy band gap of about 4 electron-volts (eV) or greater, for example. Specifically, in an embodiment, the organo-metal salt may include, for example, metal acetates, metal benzoates, metal acetoacetates, metal acetylacetonates, or metal stearates.

In addition to the materials described above, the first to third electron transport regions ETR1, ETR2, and ETR3 and the first intermediate electron transport region METR1 may include, for example, at least one of BCP or Bphen, but the invention is not limited thereto.

The first to third electron transport regions ETR1, ETR2, and ETR3 may include the compounds of the electron transport region described above in at least one among the first to third electron injection layers EIL1, EIL2, and EIL3, the electron transport layers ETL1, ETL2, and ETL3, and the first to third electron-side additional layers BFL1, BFL2, and BFL3. The first intermediate electron transport region METR1 may include the compounds of the electron transport region described above in at least one of the first intermediate electron transport layer METL1 or the first intermediate electron side additional layer MBFL1.

In an embodiment, the first to third electron transport regions ETR1, ETR2, and ETR3 and the first intermediate electron transport region METR1 each may have a thickness of, for example, about 1000 Å to about 1500 Å, for example. In an embodiment, when the first to third electron transport regions ETR1, ETR2, and ETR3 include the electron transport layers ETL1, ETL2, and ETL3, the electron transport layers ETL1, ETL2, and ETL3 may have a thickness of about 100 Å to about 1000 Å, for example, about 150 Å to about 500 Å. When the thickness of the first to third electron transport regions ETR1, ETR2, and ETR3 satisfies the above-described range, satisfactory electron transport properties may be obtained without a substantial increase in driving voltage. In an embodiment, when the first to third electron transport regions ETR1, ETR2, and ETR3 include the first to third electron injection layers EIL1, EIL2, and EIL3, the first to third electron injection layers EIL1, EIL2, and EIL3 may have a thickness of about 1 Å to about 100 Å, and about 3 Å to about 90 Å, for example. When the thickness of the first to third electron injection layers EIL1, EIL2, and EIL3 satisfies the above-described range, satisfactory electron injection properties may be obtained without a substantial increase in driving voltage. In an embodiment, the first intermediate electron transport layer METL1 included in the first intermediate electron transport region METR1 may have a thickness of about 100 Å to about 1000 Å, for example, about 150 Å to about 500 Å, for example.

The second electrode EL2 is provided on the first to third electron transport regions ETR1, ETR2, and ETR3. The second electrode EL2 may be a common electrode. The second electrode EL2 may be a cathode or an anode but the invention is not limited thereto. In an embodiment, when the first electrode EL1 is an anode, the second electrode EL2 may be a cathode, and when the first electrode EL1 is a cathode, the second electrode EL2 may be an anode, for example.

The second electrode EL2 may be a transflective electrode, or a transmissive electrode. In an embodiment, when the second electrode EL2 is a transmissive electrode, the second electrode EL2 may include a transparent metal oxide, for example, ITO, IZO, zinc oxide (ZnO), ITZO, etc.

In an embodiment, when the second electrode EL2 is a transflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a combination thereof (e.g., AgMg, AgYb, or MgAg). In an alternative embodiment, the second electrode EL2 may have a multilayer structure including a reflective film or a transflective film including the above-described materials, and a transparent conductive film including ITO, IZO, zinc oxide (ZnO), ITZO, etc. In an embodiment, the second electrode EL2 may include the above-described metal materials, a combination of at least two metal materials selected from the above-described metal materials, or oxides of the above-described metal materials, for example.

Although not shown, the second electrode EL2 may be connected with an auxiliary electrode. When the second electrode EL2 is connected with the auxiliary electrode, the resistance of the second electrode EL2 may decrease.

The display device in an embodiment of the invention includes a plurality of light emitting elements emitting light of different wavelengths, some of the plurality of light emitting elements include a plurality of emission layers, and some other light emitting elements include a single emission layer. In an embodiment, the first light emitting element ED-1 emitting blue light may include a plurality of first emission layers EML1, and may be a light emitting element having a tandem structure in which a first charge generation layer CGL1 is disposed between the plurality of first emission layers EML1, for example. Light emitting elements other than the first light emitting element ED-1, that is, the second light emitting element ED-2 and the third light emitting element ED-3 respectively include single emission layers EML2 and EML3. Accordingly, the display device in an embodiment of the invention may have a relatively lower driving voltage, and have increased display efficiency and element lifespan.

The light emitting element having a tandem structure has excellent efficiency compared to a general light emitting element including a single emission layer, but has an increased driving voltage. In the display device in an embodiment of the invention, a tandem structure is applied to a light emitting element having a relatively greater reduction in luminance lifespan, for example, the first light emitting element emitting blue light to secure high display efficiency and element lifespan, a general light emitting element structure including a single emission layer is applied to the remaining light emitting elements to prevent a significant increase in driving voltage and increase display efficiency and luminance lifespan of the whole display device.

A capping layer CPL may be further disposed on the second electrode EL2 of the first to third light emitting elements ED-1, ED-2, and ED-3. The capping layer CPL may include a single layer or a multilayer.

In an embodiment, the capping layer CPL may be an organic layer or an inorganic layer. In an embodiment, when the capping layer CPL includes an inorganic material, the inorganic material may include an alkali metal compound such as LiF, an alkaline earth metal compound such as $MgF_2$, SiON, $SiN_X$, SiOy, etc., for example.

In an embodiment, when the capping layer CPL includes an organic material, the organic material may include at least one of α-NPD, NPB, TPD, m-MTDATA, $Alq_3$ CuPc, N4,N4,N4',N4'-tetra(biphenyl-4-yl) biphenyl-4,4'-diamine ("TPD15"), 4,4',4"-tris(carbazol sol-9-yl)triphenylamine ("TCTA"), etc., or may include epoxy resins or acrylates such as methacrylates, for example. However, the invention is not limited thereto, and at least one from the compounds P1 to P5 below may also be included.

P1

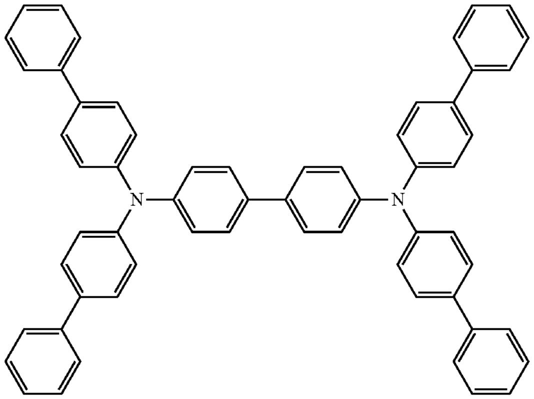

P2

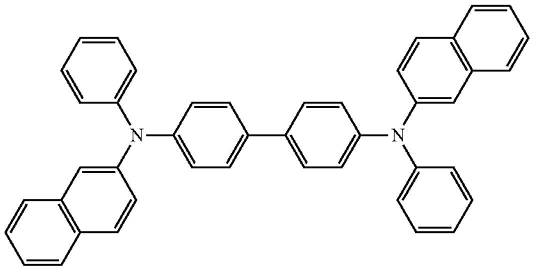

P3

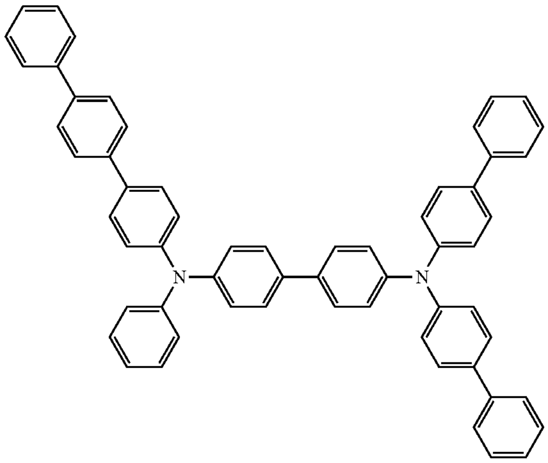

P4

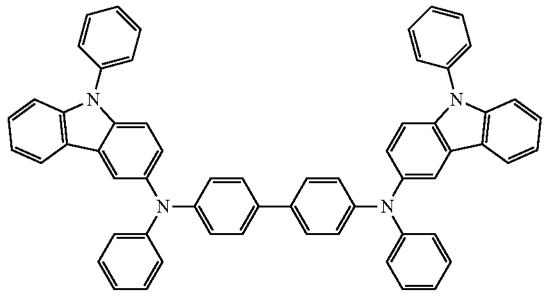

-continued

P5

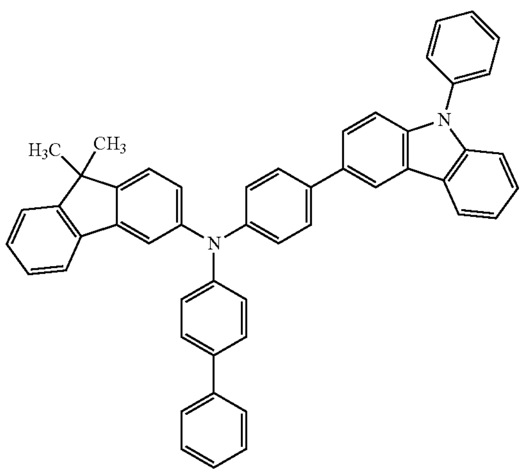

In an embodiment, the capping layer CPL may have a refractive index of about 1.6 or greater, for example. In the embodiment, the capping layer CPL may have a refractive index of about 1.6 or greater in a wavelength range of about 550 nm to about 660 nm, for example.

Some of the light emitting elements ED-1 among the plurality of light emitting elements ED-1, ED-2, and ED-3 included in the display device DD in an embodiment may include a plurality of emission layers EML1-1 and EML1-2, and the plurality of emission layers EML1-1 and EML1-2 each may have different optical distances spaced apart from the first electrode EL1. In the description, the "optical distance" may refer to a resonance distance of emission layer-generated light reflected from a reflective interface. In the description, the optical distance of the emission layer may be also referred to as a minimum distance from the center of the emission layer to an upper surface of the first electrode ELL which is a reflective interface. The emission center of the emission layer may be a point having half a thickness of the emission layer.

In the first light emitting element ED-1 including the plurality of emission layers EML1-1 and EML1-2, the 1-1st sub-emission layer EML1-1 may be disposed at a point having an 1-1st optical distance OD1-1, and the 2-1st sub-emission layer EML1-2 may be disposed at a point having a 1-2nd optical distance OD1-2. The 1-1st optical distance OD1-1 may be an $n^{th}$ resonance distance of first light generated in the 1-1st sub-emission layer EML1-1. The 1-2nd optical distance OD1-2 may be an $(n+a)^{th}$ resonance distance of first light generated in the 2-1st sub-emission layer EML1-2. In the description, n and a are each independently an integer of 1 or greater. In an embodiment, the 1-1st sub-emission layer EML1-1 may be spaced apart from the first electrode EL1 by a second resonance distance of first light, and the 2-1st sub-emission layer EML1-2 may be spaced apart from the first electrode EL1 by a third resonance distance of first light, for example. However, the invention is not limited thereto, and the 1-1st sub-emission layer EML1-1 may be spaced apart from the first electrode EL1 by a first resonance distance of first light, and the 2-1st sub-emission layer EML1-2 may be spaced apart from the first electrode EL1 by a third resonance distance of first light. The first light emitting element ED-1 having a tandem structure including the plurality of emission layers EML1-1 and EML1-2 and the first charge generation layer CGL1 disposed between the plurality of emission layers EML1-1 and EML1-2 may have high efficiency and increased luminance lifespan through controlled optical distances of each of the plurality of emission layers EML1-1 and EML1-2.

An emission layer included in the second light emitting element ED-2 and the third light emitting element ED-3 including one light emitting layer may be disposed at a position having the same ordinal number of resonance distance as any one of a plurality of emission layers included in the first light emitting element ED-1. In an embodiment, the 1-1st sub-emission layer EML1-1 included in the first light emitting element ED-1 may be spaced apart from the first electrode EL1 by an $n^{th}$ resonance distance, the second emission layer EML2 may be spaced apart from the first electrode EL1 by a second optical distance OD2, which is an $n^{th}$ resonance distance of second light, and the third emission layer EML3 may be spaced apart from the first electrode EL1 by a third optical distance OD3, which is an $n^{th}$ resonance distance of third light. In an embodiment, the 1-1st sub-emission layer EML1-1 may be spaced apart from the first electrode EL1 by a second resonance distance of first light, the second emission layer EML2 may be spaced apart from the first electrode EL1 by a second resonance distance of second light, and the third emission layer EML3 may be spaced apart from the first electrode EL1 by a second resonance distance of third light, for example. Alternately, the 1-1st sub-emission layer EML1-1 may be spaced apart from the first electrode EL1 by a first resonance distance of first light, the second emission layer EML2 may be spaced apart from the first electrode EL1 by a first resonance distance of second light, and the third emission layer EML3 may be spaced apart from the first electrode EL1 by a first resonance distance of third light. However, the invention is not limited thereto, and the second emission layer EML2 may be spaced apart from the first electrode EL1 by an $(n+a)^{th}$ resonance distance of second light, and the third emission layer EML3 may be spaced apart from the first electrode EL1 by an $(n+a)^{th}$ resonance distance of third light.

In an embodiment of the invention, the first light emitting element ED-1 having a tandem structure including the plurality of emission layers EML1-1 and EML1-2 may dispose an emission layer at a position having a different ordinal number of resonance distance to increase the light efficiency of a predetermined color, thereby having increased display efficiency.

FIGS. 5A to 5E are cross-sectional views of another embodiment of a display device according to the invention. FIGS. 5A to 5E illustrate that, in a cross section of a display device corresponding to line I-I' of FIG. 1 as in FIGS. 2A and 2B, a cross-sectional view of display devices of an embodiment in which a light emitting element including a plurality of emissions layers is different from the one shown in FIGS. 2A and 2B. Hereinafter, in describing a display device in an embodiment with reference to FIGS. 5A to 5E, the same reference numerals are given for the same components as those described above, and detailed descriptions are omitted.

Figure 5A:
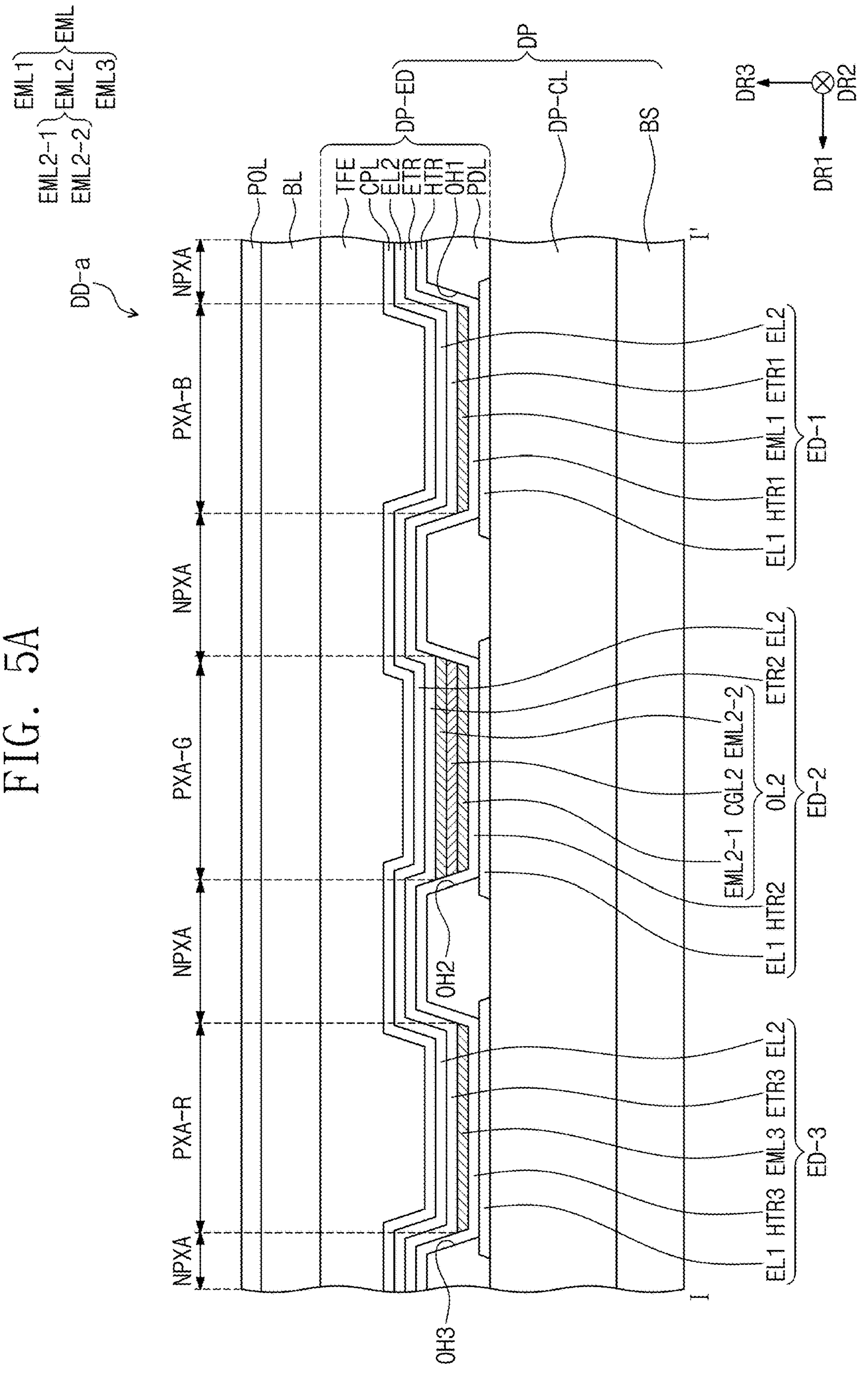
FIGS. 5A to 5E are cross-sectional views of another embodiment of a display device according to the invention.

Referring to FIG. 5A, in a display device DD-a in an embodiment, among the plurality of light emitting elements ED-1, ED-2, and ED-3, the second light emitting element ED-2 emitting second light, which is green light may include a second organic layer OL2 including a plurality of second emission layers EML2-1 and EML2-2, and the other two light emitting elements each, that is, the first light emitting element ED-1 and the third light emitting element ED-3, may include one emission layer EML1 and EML3. The second light emitting element ED-2 may include a 1-2nd sub-emission layer EML2-1 and a 2-2nd sub-emission layer EML2-2, and a second charge generation layer CGL2 may be disposed between the 1-2nd sub-emission layer EML2-1 and the 2-2nd sub-emission layer EML2-2. In the display device DD-a in an embodiment, a light emitting element including a plurality of emission layers, that is, the second light emitting element ED-2 may have similar descriptions to those described in the first light emitting element ED-1 shown in FIG. 4A, and a light emitting element including one emission layer, that is, the first light emitting element ED-1 and the third light emitting element ED-3 may have similar descriptions to the second light emitting element ED-2 and the third light emitting element ED-3 described in FIGS. 4B and 4C.

Figure 5B:
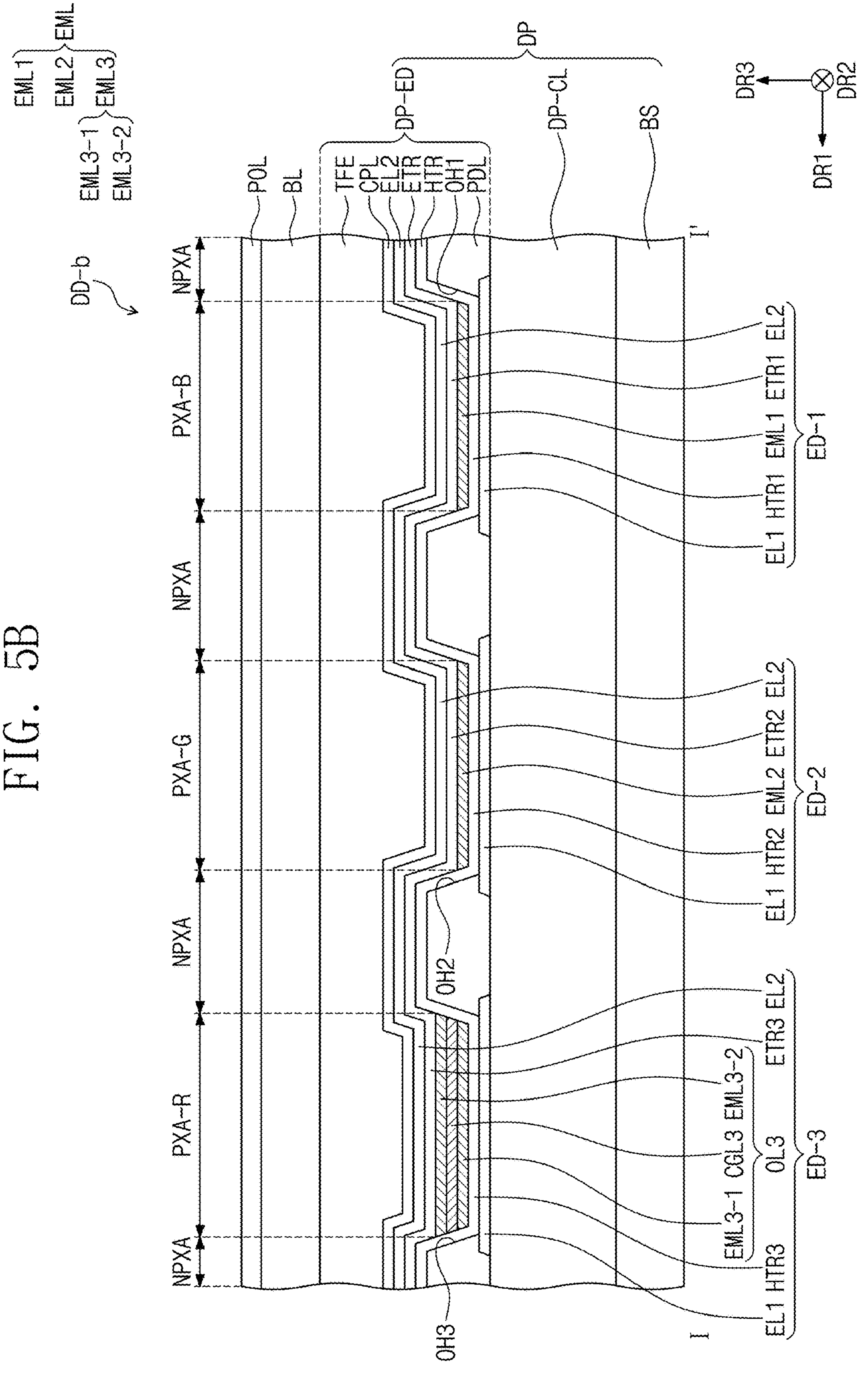

Referring to FIG. 5B, in a display device DD-b in an embodiment, among the plurality of light emitting elements ED-1, ED-2, and ED-3, the third light emitting element ED-3 emitting third light, which is red light may include a third organic layer OL3 including a plurality of third emission layers EML3-1 and EML3-2, and the other two light emitting elements each, that is, the first light emitting element ED-1 and the second light emitting element ED-2, may include one emission layer EML1 and EML2. The third light emitting element ED-3 may include a 1-3rd sub-emission layer EML3-1 and a 2-3rd sub-emission layer EML3-2, and a third charge generation layer CGL3 may be disposed between the 1-3rd sub-emission layer EML3-1 and the 2-3rd sub-emission layer EML3-2. In the display device DD-b in an embodiment, a light emitting element including a plurality of emission layers, that is, the third light emitting element ED-3 may have similar descriptions to those described in the first light emitting element ED-1 shown in FIG. 4A, and a light emitting element including one emission layer, that is, the first light emitting element ED-1 and the second light emitting element ED-2 may have similar descriptions to the second light emitting element ED-2 and the third light emitting element ED-3 described in FIGS. 4B and 4C.

Figure 5C:
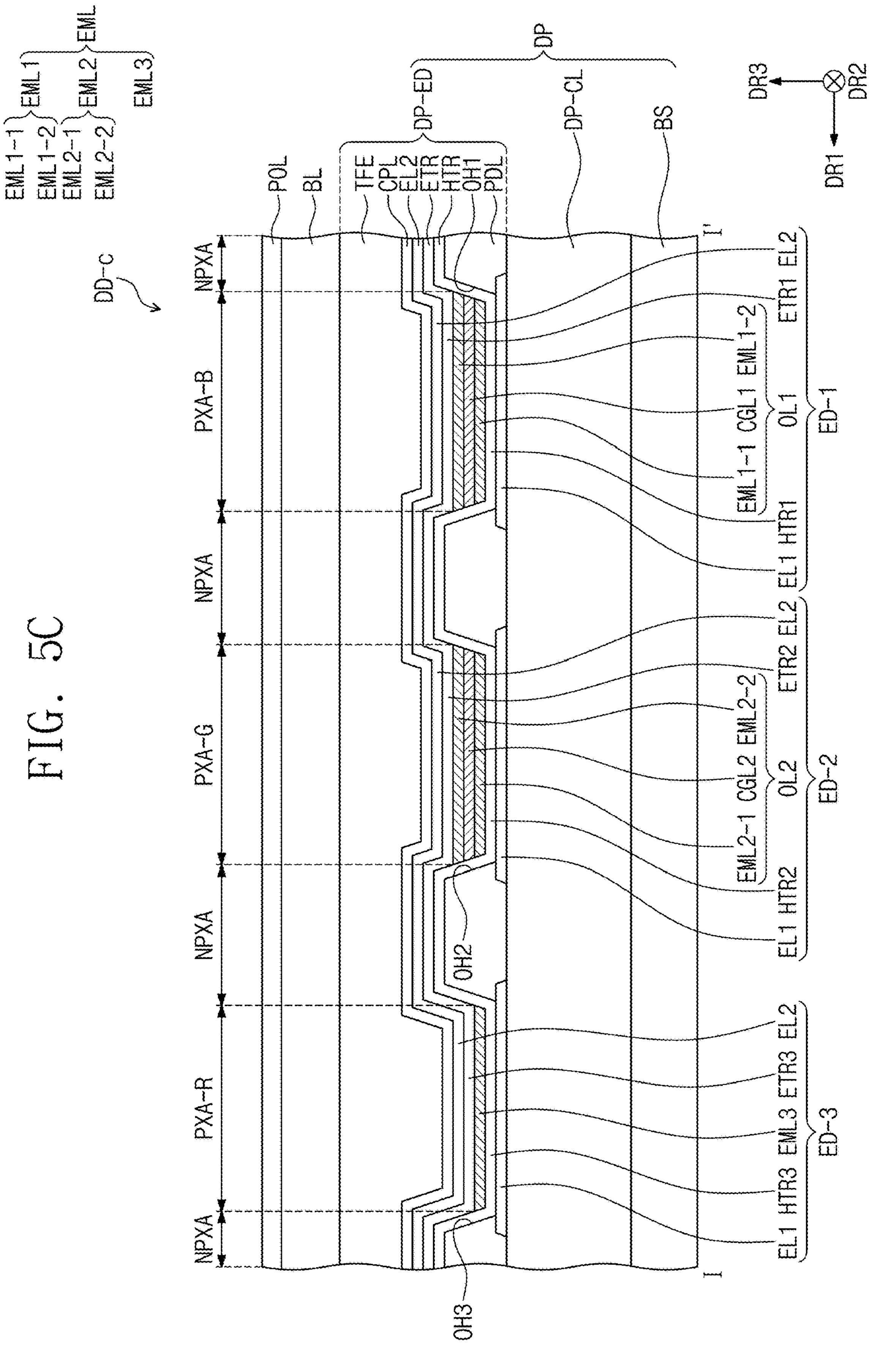

Referring to FIG. 5C, in a display device DD-c in an embodiment, among the plurality of light emitting elements ED-1, ED-2, and ED-3, the first light emitting elements ED-1 emitting first light, which is blue light, may include the first organic layer OL1 including a plurality of first emission layer EML1-1 and EML1-2, the second light emitting element ED-2 emitting second light, which is green light, may include the second organic layer OL2 including a plurality of second emission layers EML2-1 and EML2-2, and the remaining light emitting element, that is, the third light emitting element ED-3 may include one third emission layer EML3. The first light emitting element ED-1 may include an 1-1st sub-emission layer EML1-1 and a 2-1st sub-emission layer EML1-2, and a first charge generation layer CGL1 may be disposed between the 1-1st sub-emission layer EML1-1 and the 2-1st sub-emission layer EML1-2. The second light emitting element ED-2 may include a 1-2nd sub-emission layer EML2-1 and a 2-2nd sub-emission layer EML2-2, and a second charge generation layer CGL2 may be disposed between the 1-2nd sub-emission layer EML2-1 and the 2-2nd sub-emission layer EML2-2. In the display device DD-c in an embodiment, a light emitting element including a plurality of emission layers, that is, the first light emitting element ED-1 and the second light emitting element ED-2 may have similar descriptions to those described in the first light emitting element ED-1 shown in FIG. 4A, and a light emitting element including one emission layer, that is, the third light emitting element ED-3 may have similar descriptions to the second light emitting element ED-2 and the third light emitting element ED-3 described in FIGS. 4B and 4C.

Figure 5D:
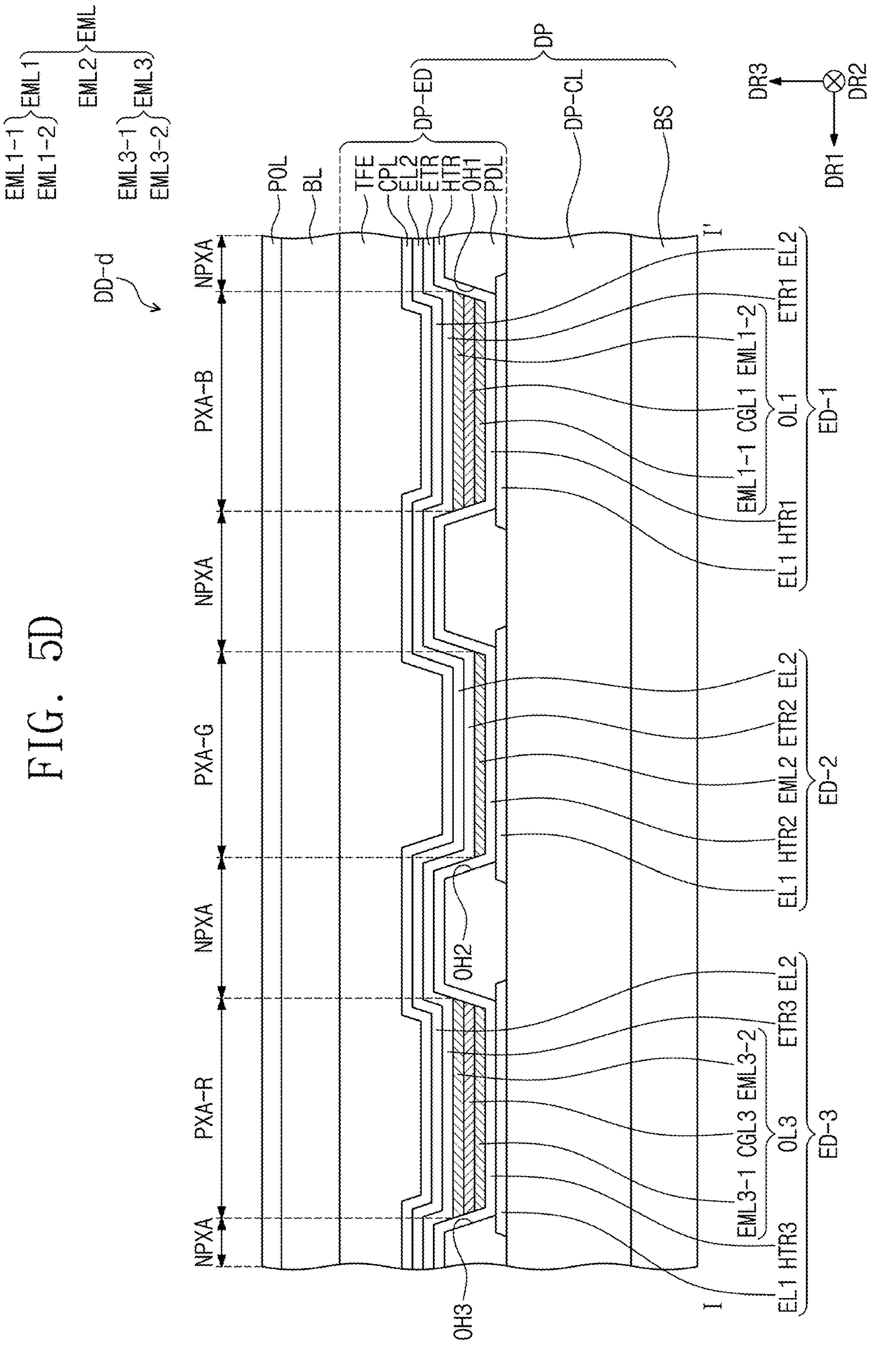

Referring to FIG. 5D, in a display device DD-d in an embodiment, among the plurality of light emitting elements ED-1, ED-2, and ED-3, the first light emitting elements ED-1 emitting first light, which is blue light, may include the first organic layer OL1 including the plurality of first emission layer EML1-1 and EML1-2, the third light emitting element ED-3 emitting third light, which is red light, may include the third organic layer OL3 including the plurality of third emission layers EML3-1 and EML3-2, and the remaining light emitting element, that is, the second light emitting element ED-2 may include one second emission layer EML2. The first light emitting element ED-1 may include an 1-1st sub-emission layer EML1-1 and a 2-1st sub-emission layer EML1-2, and a first charge generation layer CGL1 may be disposed between the 1-1st sub-emission layer EML1-1 and the 2-1st sub-emission layer EML1-2. The third light emitting element ED-3 may include a 1-3rd sub-emission layer EML3-1 and a 2-3rd sub-emission layer EML3-2, and a third charge generation layer CGL3 may be disposed between the 1-3rd sub-emission layer EML3-1 and the 2-3rd sub-emission layer EML3-2. In the display device DD-d in an embodiment, a light emitting element including a plurality of emission layers, that is, the first light emitting element ED-1 and the third light emitting element ED-3 may have similar descriptions to those described in the first light emitting element ED-1 shown in FIG. 4A, and a light emitting element including one emission layer, that is, the second light emitting element ED-2 may have similar descriptions to the second light emitting element ED-2 and the third light emitting element ED-3 described in FIGS. 4B and 4C.

Figure 5E:
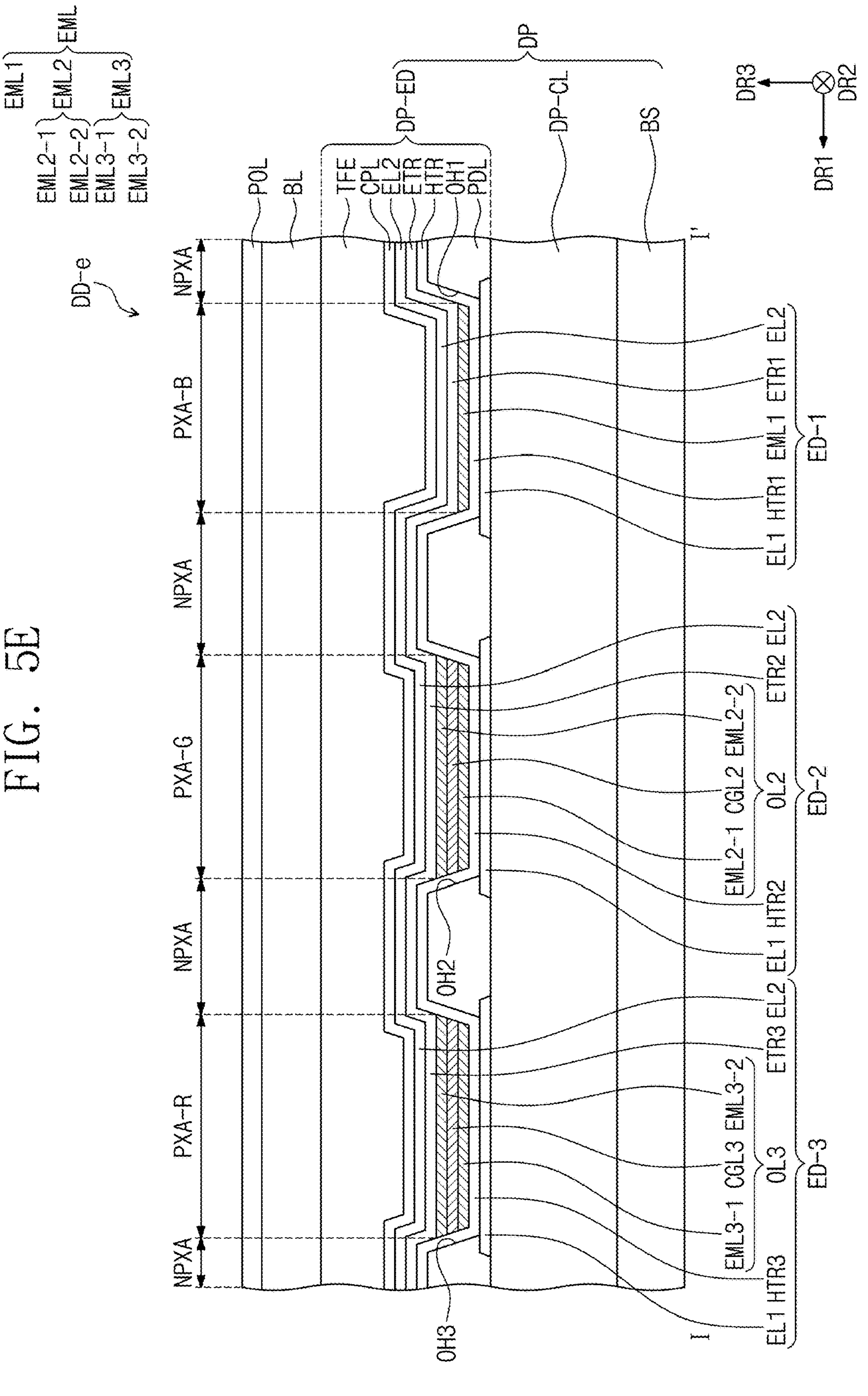

Referring to FIG. 5E, in a display device DD-e in an embodiment, among the plurality of light emitting elements ED-1, ED-2, and ED-3, the second light emitting elements ED-2 emitting second light, which is green light, may include the second organic layer OL2 including the plurality of second emission layers EML2-1 and EML2-2, the third light emitting element ED-3 emitting third light, which is red light, may include the third organic layer OL3 including the plurality of third emission layers EML3-1 and EML3-2, and the remaining light emitting element, that is, the first light emitting element ED-1 may include one first emission layer EML1. The second light emitting element ED-2 may include a 1-2nd sub-emission layer EML2-1 and a 2-2nd sub-emission layer EML2-2, and a second charge generation layer CGL2 may be disposed between the 1-2nd sub-emission layer EML2-1 and the 2-2nd sub-emission layer EML2-2. The third light emitting element ED-3 may include a 1-3rd sub-emission layer EML3-1 and a 2-3rd sub-emission layer EML3-2, and a third charge generation layer CGL3 may be disposed between the 1-3rd sub-emission layer EML3-1 and the 2-3rd sub-emission layer EML3-2. In the display device DD-e in an embodiment, a light emitting element including a plurality of emission layers, that is, the second light emitting element ED-2 and the third light emitting element ED-3 may have similar descriptions to those described in the first light emitting element ED-1 shown in FIG. 4A, and a light emitting element including one emission layer, that is, the first light emitting element ED-1 may have similar descriptions to the second light emitting element ED-2 and the third light emitting element ED-3 described in FIGS. 4B and 4C.

Figure 6A:
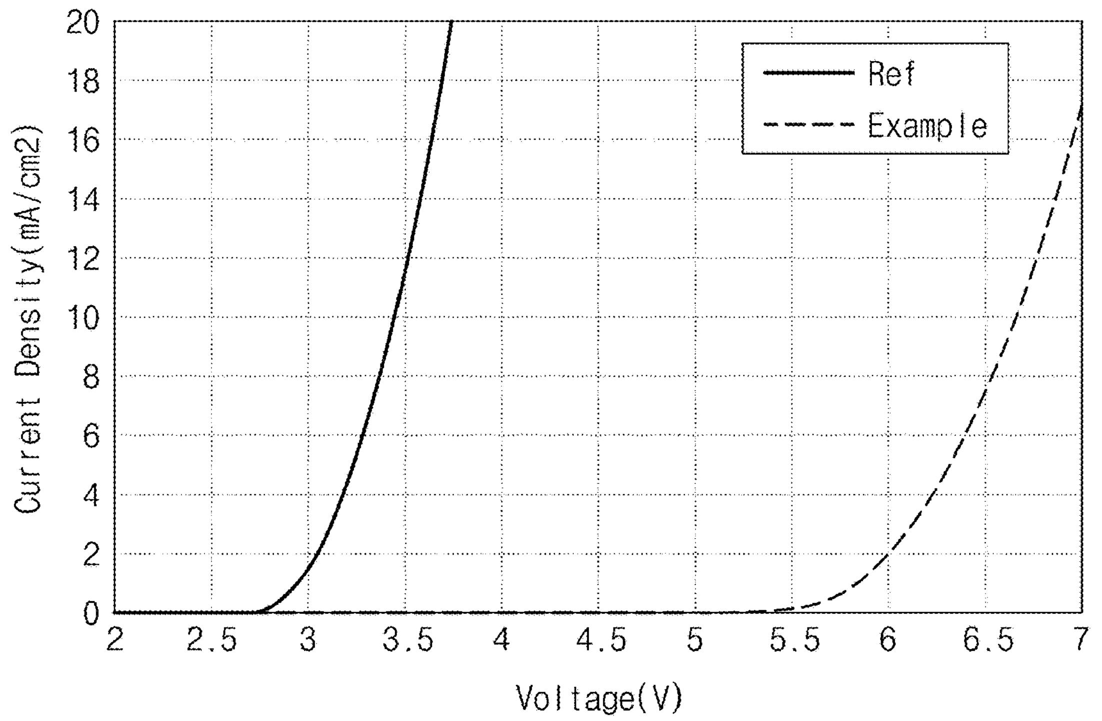
FIG. 6A is a graph showing a comparison of current densities according to driving voltages of an embodiment of a first light emitting element and Comparative Example of a first light emitting element according to Comparative Example.
Figure 6B:
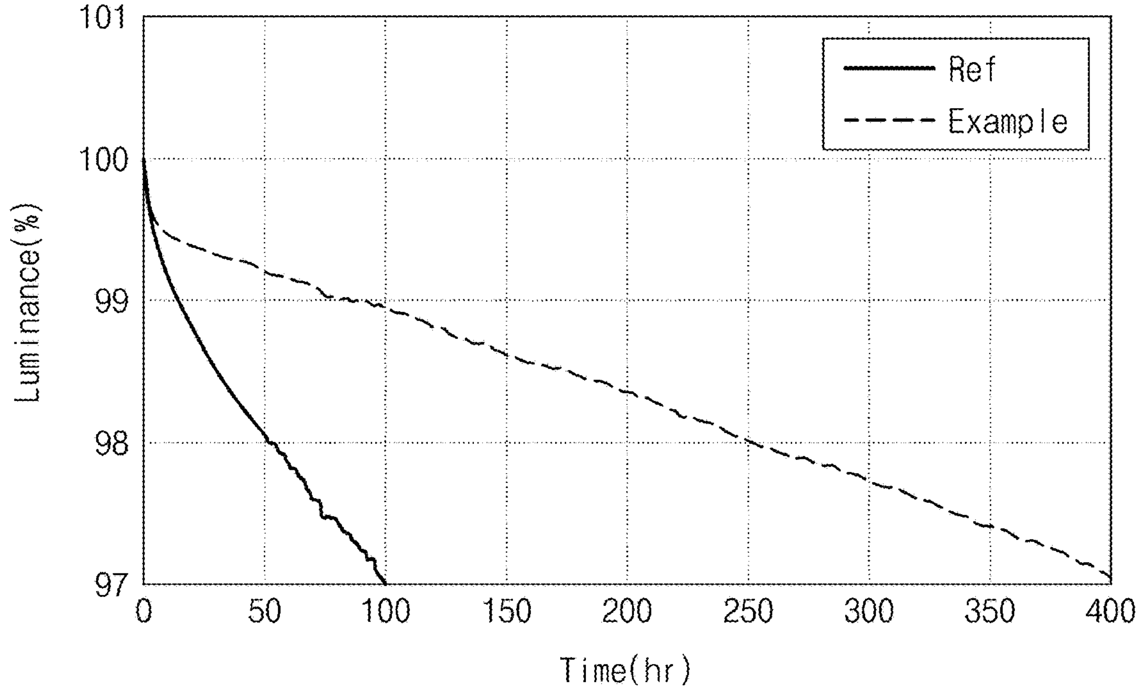
FIG. 6B is a graph showing a comparison of luminance over time of an embodiment of a first light emitting element according to the invention and Comparative Example of a first light emitting element.

FIG. 6A is a graph showing a comparison of current densities according to driving voltages of an embodiment of a first light emitting element according to the invention and Comparative Example of a first light emitting element. FIG. 6B is a graph showing a comparison of luminance over time of an embodiment of a first light emitting element according to the invention and Comparative Example of a first light emitting element. FIG. 6B illustrates luminance of a first light emitting element measured over time at a temperature of about 97 degrees Celsius (° C.).

In FIGS. 6A and 6B, "Example" is a graph showing the element efficiency of a first light emitting element including a plurality of emission layers and emitting blue light as shown in FIG. 4A. "Ref" is a graph showing the element efficiency of a first light emitting element without including a plurality of emission layers unlike the one shown in FIG. 4A and including one emission layer and emitting blue light.

Referring to FIG. 6A, it is seen that the first light emitting element of an embodiment had a driving voltage about 1.7 times to about 1.9 times greater than the first light emitting element of Comparative Example at a current density of about 10 milliamperes per square centimeter ($mA/cm^2$) to about 15 $mA/cm^2$. However, referring to FIG. 6B, it is be seen that the time when the luminance falls to about 97% or less at about 97° C. for the first light emitting element of Example is about 4 times greater than the time for the first light emitting element of Comparative Example. In addition, results of measuring external quantum efficiency confirmed that the first light emitting element of Example had the external quantum efficiency about 1.6 times to about 1.7 times greater than the first light emitting element of Comparative Example at a current density of about 10 $mA/cm^2$ to about 15 $mA/cm^2$. Accordingly, it is found that the first light emitting element in an embodiment of the invention has a tandem structure which causes an increase in driving voltage compared to a general light emitting element including one emission layer, but increases element efficiency and luminance lifespan. In addition, results of simulation confirmed that when the first light emitting element having a tandem structure in an embodiment is applied to a display device together with a second light emitting element and a third light emitting element having one emission layer, the display efficiency of the display device is increased by about 135%.

In the display device in an embodiment of the invention, a light emitting element having a relatively greater reduction in luminance lifespan and a decrease in display efficiency compared to other light emitting elements, for example, the first light emitting element emitting blue light, includes a tandem structure which causes an increase in driving voltage but achieves greater element efficiency and luminance lifespan, and the light emitting elements having relatively less reduction in luminance lifespan and having high display efficiency, that is, the second light emitting element emitting green light and the third light emitting element emitting red light include a general light emitting element structure including only one emission layer to prevent a significant increase in driving voltage and to achieve greater element efficiency and luminance lifespan of the whole display device as well.

In an embodiment of the invention, a plurality of light emitting structure stacks are provided to some light emitting elements among a plurality of light emitting elements included in a display device, and one light emitting structure stack is provided to the other light emitting elements, thereby preventing a significant increase in driving voltage of the display device, and increasing the display efficiency and luminance lifespan of the whole display device.

Although the invention has been described with reference to a preferred embodiment of the invention, it will be understood that the invention should not be limited to these preferred embodiments but various changes and modifications may be made by those skilled in the art without departing from the spirit and scope of the invention. Accordingly, the technical scope of the invention is not intended to be limited to the contents set forth in the detailed description of the specification.

What is claimed is:

1. A display device comprising:

a substrate in which a first pixel area which emits first light, a second pixel area which emits second light having a different emission wavelength from an emission wavelength of the first light, and a third pixel area which emits third light having a different emission wavelength from the emission wavelength of the first light and the emission wavelength of the second light are defined;

a first electrode disposed on the substrate and overlapping the first pixel area, the second pixel area, and the third pixel area;

a hole transport region disposed on the first electrode and overlapping the first pixel area, the second pixel area, and the third pixel area;

a first organic layer disposed on the hole transport region and overlapping the first pixel area, the first organic layer including:

a plurality of first emission layers which emit the first light; and a first charge generation layer disposed between the plurality of first emission layers;

a second organic layer disposed on the hole transport region and overlapping the second pixel area, the second organic layer including a single second emission layer which emits the second light so that the second pixel area consists of the single second emission layer without another emission layer overlapping the single second emission layer in a direction perpendicular to a main extension direction of the substrate;

a third organic layer disposed on the hole transport region and overlapping the third pixel area, the third organic layer including a single third emission layer which emits the third light so that the third pixel area consists of the single third emission layer without another emission layer overlapping the single third emission layer in a direction perpendicular to the main extension direction of the substrate;

an electron transport region disposed on the first organic layer and the second organic layer and overlapping the first pixel area, the second pixel area, and the third pixel area; and a second electrode disposed on the electron transport region and overlapping the first pixel area, the second pixel area, and the third pixel area, wherein each of the plurality of first emission layers does not overlap each of the single second emission layer and the single third emission layer in the direction perpendicular to the main extension direction of the substrate, and the first light is blue light, the second light is one of green light and red light and the third light is a remaining one of the green light and the red light.

2. The display device of claim 1, wherein each of the single second emission layer and the single third emission layer is in contact with the hole transport region and the electron transport region.

3. The display device of claim 1, wherein:
the hole transport region comprises a hole injection layer disposed on the first electrode, and a hole transport layer disposed on the hole injection layer; and
the electron transport region comprises an electron transport layer disposed on the first organic layer and the second organic layer, and an electron injection layer disposed on the electron transport layer.

4. The display device of claim 3, wherein:
the hole transport region further comprises a hole side additional layer disposed between the first and second organic layers and the hole transport layer;
the electron transport region further comprises an electron side additional layer disposed between the first and second organic layers and the electron transport layer; and
the single second emission layer is in contact with the hole side additional layer and the electron side additional layer.

5. The display device of claim 1, further comprising a capping layer disposed on the second electrode, wherein the capping layer has a refractive index of about 1.6 or greater.

6. The display device of claim 1, wherein the first organic layer comprises:
a first sub-emission layer disposed between the hole transport region and the first charge generation layer; and
a second sub-emission layer disposed between the first charge generation layer and the electron transport region.

7. The display device of claim 6, wherein:
the first sub-emission layer is spaced apart from the first electrode by an $n^{th}$ resonance distance of the first light where n is an integer of 1 or greater; and
the second sub-emission layer is spaced apart from the first electrode by an $(n+a)^{th}$ resonance distance of the first light where a is an integer of 1 or greater.

8. The display device of claim 6, wherein the first charge generation layer comprises:
an n-type charge generation layer disposed adjacent to the first sub-emission layer; and
a p-type charge generation layer disposed adjacent to the second sub-emission layer.

9. The display device of claim 1, further comprising:
a thin film encapsulation layer disposed on the second electrode; and
an anti-reflection layer disposed on the thin film encapsulation layer.

10. A display device comprising:
a substrate in which a first pixel area which emits first light, a second pixel area which emits second light different from the first light, and a third pixel area which emits third light different from the first light and the second light are defined;
a first light emitting element overlapping the first pixel area;
a second light emitting element overlapping the second pixel area; and
a third light emitting element overlapping the third pixel area,
wherein one light emitting element of the first light emitting element, the second light emitting element, and the third light emitting element includes at least two light emitting unit structures each including a single emission layer, and
remaining two light emitting elements of the first light emitting element, the second light emitting element, and the third light emitting element include a single light emitting unit structure including a single emission layer so that two of the first pixel area, the second pixel area and the third pixel area respectively corresponding the remaining two light emitting elements each consist of the single emission layer without another emission layer overlapping the single emission layer in a direction perpendicular to a main extension direction of the substrate,
wherein each of the two light emitting unit structures each including the single emission layer does not overlap the single light emitting unit structure including the single emission layer in the direction perpendicular to the main extension direction of the substrate, and
the first light is blue light, the second light is one of green light and red light and the third light is a remaining one of the green light and the red light.

11. The display device of claim 10, wherein the first light emitting element, the second light emitting element, and the third light emitting element each comprise a first electrode and a second electrode spaced apart from the first electrode with the at least two light emitting unit structures or the single light emitting unit therebetween, and
the at least two light emitting unit structures each comprise:
a hole transport layer disposed on the first electrode;
the single emission layer disposed on the hole transport layer; and
an electron transport layer disposed on the single emission layer.

12. The display device of claim 11, wherein:
the first light emitting element comprises at least two light emitting unit structures;
the second light emitting element comprises a single light emitting unit structure; and
in the second light emitting element, the single light emitting unit structure is in contact with the first electrode and the second electrode.

13. A display device comprising:
a substrate in which a first pixel area which emits first light, a second pixel area which emits second light different from the first light, and a third pixel area which emits third light having a different emission wavelength from the emission wavelength of the first light and the emission wavelength of the second light are defined;
a first electrode disposed on the substrate and overlapping the first pixel area, the second pixel area, and the third pixel area;
a hole transport region disposed on the first electrode and overlapping the first pixel area, the second pixel area, and the third pixel area;
a plurality of first emission layers disposed on the hole transport region and overlapping the first pixel area, the plurality of first emission layers including:
a first sub-emission layer spaced apart from the first electrode by an $n^{th}$ resonance distance of the first light where n is an integer of 1 or greater; and
a second sub-emission layer spaced apart from the first electrode by an $(n+a)^{th}$ resonance distance of the first light where a is an integer of 1 or greater;
a single second emission layer disposed on the hole transport region and overlapping the second pixel area so that the second pixel area consists of the single second emission layer without another emission layer overlapping the single second emission layer in a direction perpendicular to a main extension direction of the substrate;

a single third emission layer disposed on the hole transport region and overlapping the third pixel area so that the third pixel area consists of the single third emission layer without another emission layer overlapping the single third emission layer in a direction perpendicular to the main extension direction of the substrate;

an electron transport region disposed on the plurality of first emission layers and the single second emission layer and overlapping the first pixel area, the second pixel area, and the third pixel area; and a second electrode disposed on the electron transport region and overlapping the first pixel area, the second pixel area, and the third pixel area, wherein each of the plurality of first emission layers does not overlap each of the single second emission layer and the single third emission layer in the direction perpendicular to the main extension direction of the substrate, and the first light is blue light, the second light is one of green light and red light and the third light is a remaining one of the green light and the red light.

14. The display device of claim 13, wherein the single second emission layer is in contact with the hole transport region and the electron transport region.

* * * * *